United States Patent
Inoue et al.

(10) Patent No.: US 8,438,726 B2
(45) Date of Patent: May 14, 2013

(54) METHOD OF MANUFACTURING PRINTED CIRCUIT BOARD

(75) Inventors: Shinichi Inoue, Ibaraki (JP); Hiroyuki Hanazono, Ibaraki (JP); Mineyoshi Hasegawa, Ibaraki (JP); Keisuke Okumura, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 74 days.

(21) Appl. No.: 13/083,097

(22) Filed: Apr. 8, 2011

(65) Prior Publication Data

US 2011/0277321 A1    Nov. 17, 2011

(30) Foreign Application Priority Data

May 17, 2010  (JP) .................................. 2010-112801
Aug. 20, 2010  (JP) .................................. 2010-185267

(51) Int. Cl.
*H05K 3/02* (2006.01)
(52) U.S. Cl.
USPC .................. 29/846; 29/825; 29/840; 174/250
(58) Field of Classification Search .................... 29/825, 29/840, 846; 174/250
See application file for complete search history.

(56) References Cited

U.S. PATENT DOCUMENTS

| | | | |
|---|---|---|---|
| 4,604,160 A | 8/1986 | Murakami et al. | |
| 5,013,397 A * | 5/1991 | Tsukakoshi | 216/20 |
| 7,477,194 B2 * | 1/2009 | Coleman et al. | 343/700 MS |
| 7,930,815 B2 * | 4/2011 | Coleman et al. | 29/600 |
| 8,230,588 B2 * | 7/2012 | Miyamoto et al. | 29/832 |
| 2005/0026028 A1 | 2/2005 | Ouchi et al. | |
| 2008/0298036 A1 | 12/2008 | Yamazaki et al. | |
| 2009/0084494 A1 | 4/2009 | An et al. | |
| 2009/0191441 A1 | 7/2009 | Yoshida et al. | |

FOREIGN PATENT DOCUMENTS

| | | |
|---|---|---|
| JP | 2001339131 A | 12/2001 |
| JP | 2007210145 A | 8/2007 |
| JP | 2008258482 A | 10/2008 |
| JP | 2008300238 A | 12/2008 |
| JP | 2009049444 A | 3/2009 |
| JP | 2009140618 A | 6/2009 |
| JP | 2009238597 A | 10/2009 |
| WO | 2008023634 A1 | 2/2008 |

OTHER PUBLICATIONS

EP Search Report issued Aug. 22, 2011 in EP Application No. 11158580.

* cited by examiner

*Primary Examiner* — Carl Arbes
(74) *Attorney, Agent, or Firm* — Panitch Schwarze Belisario & Nadel LLP

(57) ABSTRACT

A resist film is formed on a conductor layer of a two-layered base material composed of a carrier layer and the conductor layer. Next, the resist film is exposed and developed, so that an etching resist pattern is formed. A region of the conductor layer that is exposed while not covered with the etching resist pattern is removed by etching. A conductor pattern is formed by removing the etching resist pattern. Then, an adhesive layer precursor is applied on an entire surface including an upper surface of the conductor pattern. The adhesive layer precursor is exposed and developed, so that an adhesive pattern is formed on the conductor pattern. After that, a base insulating layer is joined onto the conductor pattern with the adhesive pattern sandwiched therebetween. Finally, a carrier layer is separated from the conductor pattern, so that the FPC board is manufactured.

12 Claims, 12 Drawing Sheets

FIG. 1
(a)
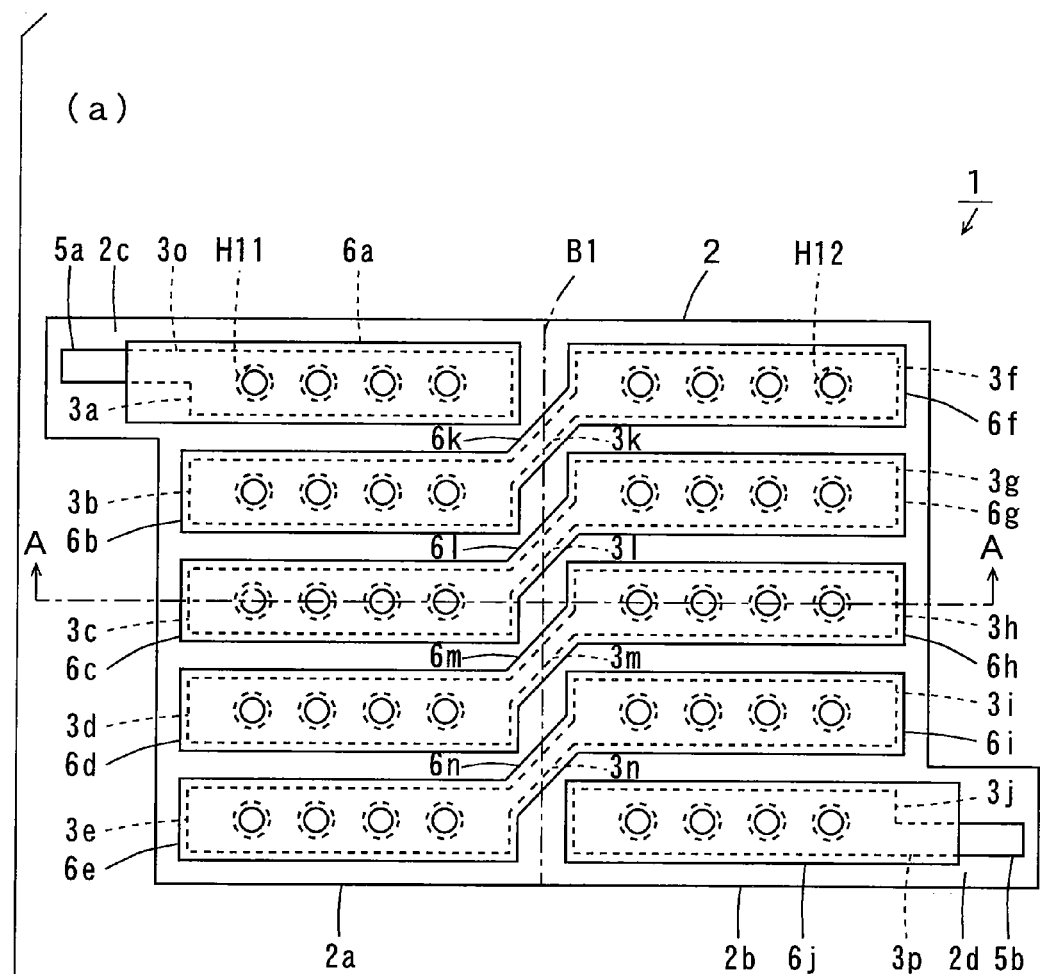
(b)
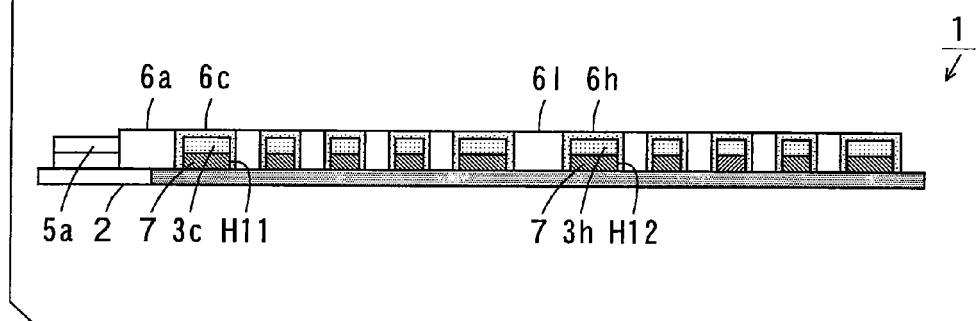

METHOD OF MANUFACTURING PRINTED CIRCUIT BOARD

BACKGROUND OF THE INVENTION

1. Field of the Invention

The present invention relates to a method of manufacturing a printed circuit board.

2. Description of the Background Art

Printed circuit boards are used as transmission paths of electrical signals among circuit elements in batteries such as fuel cells or in electronic apparatuses such as hard disk drives. A resist layer having a given pattern is formed on a conductive layer on a base insulating layer in manufacture of the printed circuit board. In this state, an exposed region of the conductive layer is etched using an etching solution, so that a given conductor pattern is formed. After that, the resist layer is removed, and a cover insulating layer is then formed to cover the conductor pattern. In this manner, the printed circuit board having the desired conductor pattern can be manufactured by etching the conductor layer (see JP 2008-258482 A, for example).

It is preferable to optimally select a material used for the base insulating layer of the printed circuit board depending on uses of the printed circuit board. In conventional methods of manufacturing the printed circuit board, however, materials that can be used for the base insulating layer are limited to high chemical-resistant materials such as polyimide, which prevent the base insulating layer from being dissolved by the etching solution during the etching of the conductor layer.

BRIEF SUMMARY OF THE INVENTION

An object of the present invention is to provide a method of manufacturing a printed circuit board in which a type of a material used for a base insulating layer is not limited.

(1) According to an aspect of the present invention, a method of manufacturing a printed circuit board includes the steps of forming a conductor pattern, which is composed of a conductor layer having a given pattern, on one surface of a support layer, joining an insulating layer onto the conductor pattern, and separating the support layer from the conductor pattern.

In the method of manufacturing the printed circuit board, the conductor pattern made of the conductor layer having the given pattern is formed on the one surface of the support layer. Next, the insulating layer is joined onto the conductor pattern. The support layer is then separated from the conductor pattern.

As described above, the insulating layer does not exist when the conductor pattern is formed, and the insulating layer is joined onto the conductor pattern after the formation of the conductor pattern. Therefore, the insulating layer is prevented from being dissolved or deformed because of the formation of the conductor pattern. This does not limit the type of the material used for the insulating layer. As a result, the insulating layer can be formed using various materials depending on uses.

(2) The step of forming the conductor pattern may include the steps of preparing a base material having a laminated structure of the support layer and the conductor layer, and forming the conductor pattern on the one surface of the support layer by processing the conductor layer, and the step of joining the insulating layer onto the conductor pattern may include the steps of forming an adhesive pattern, which is composed of an adhesive layer having a given pattern, on the conductor pattern, and joining the insulating layer onto the conductor pattern with the adhesive pattern sandwiched between the insulating layer and the conductor pattern.

In this case, the conductor pattern is formed on the one surface of the support layer by processing the conductor layer of the base material having the laminated structure of the support layer and the conductor layer. The insulating layer is joined onto the conductor pattern with the adhesive pattern sandwiched therebetween. This prevents the conductor pattern from being separated from the insulating layer.

Since the adhesive pattern has the same shape as the conductor pattern, the adhesive pattern is not formed in the region of the insulating layer that is exposed while not overlapping the conductor pattern. This prevents lower flexibility of the printed circuit board.

(3) The step of joining the insulating layer onto the conductor pattern may further include the steps of forming the adhesive layer on the support layer to cover the conductor pattern, and forming the adhesive pattern by processing the adhesive layer. In this case, the adhesive pattern can be reliably formed on the conductor pattern.

(4) The adhesive layer may be photosensitive, and the step of processing the adhesive layer may include the step of subjecting the adhesive layer to exposure processing and development processing to form the adhesive pattern.

In this case, the adhesive layer is subjected to the exposure processing and the development processing, so that the adhesive pattern can be easily formed.

(5) The step of subjecting the adhesive layer to the exposure processing and the development processing may include the step of irradiating the adhesive layer with light through the support layer using the conductor pattern as a mask.

In this case, the adhesive pattern can be formed without the need to separately prepare a mask pattern. As a result, manufacturing steps and cost of the printed circuit board can be reduced.

(6) The step of forming the conductor pattern may include the steps of preparing a base material having a laminated structure of the support layer and the conductor layer, forming an adhesive pattern, which is composed of an adhesive layer having a given pattern, on the conductor layer, and forming the conductor pattern by removing an exposed region of the conductor layer using the adhesive pattern as a mask, the step of joining the insulating layer onto the conductor pattern may include the step of joining the insulating layer onto the conductor pattern with the adhesive pattern sandwiched between the insulating layer and the conductor pattern.

In this case, the adhesive pattern composed of the adhesive layer having the given pattern is formed on the conductor layer of the base material having the laminated structure of the support layer and the conductor layer. The exposed region of the conductor layer is removed using the adhesive pattern as the mask. This allows the conductor pattern to be formed without the need to separately prepare a mask pattern. As a result, manufacturing steps and cost of the printed circuit board can be reduced.

(7) The adhesive layer may be photosensitive, and the step of forming the adhesive pattern on the conductor layer may include the step of forming the adhesive pattern by subjecting the adhesive layer to exposure processing and development processing.

In this case, the adhesive layer is subjected to the exposure processing and the development processing, so that the adhesive pattern can be easily formed.

(8) The step of forming the conductor pattern may include the steps of preparing a base material having a laminated structure of the support layer and the conductor layer, and forming the conductor pattern on the one surface of the support layer by processing the conductor layer, the step of joining the insulating layer onto the conductor pattern may include the step of forming a laminated structure of an adhesive layer and the insulating layer on the conductor pattern, and the method may include the step of forming an adhesive pattern having the given pattern by separating the support layer and then removing a region of the adhesive layer that is exposed while not overlapping the conductor pattern.

In this case, the conductor pattern is formed on the one surface of the support layer by processing the conductor layer of the base material having the laminated structure of the support layer and the conductor layer. The laminated structure of the adhesive layer and the insulating layer is formed on the conductor pattern, so that the insulating layer is joined onto the conductor pattern. The support layer is separated, and the region of the adhesive layer that is exposed while not overlapping the conductor pattern is subsequently removed, so that the adhesive pattern is formed.

Since the conductor pattern can be used as the mask, the adhesive pattern can be formed without the need to separately prepare the mask pattern. As a result, manufacturing steps and cost of the printed circuit board can be reduced.

(9) The step of removing the region of the adhesive layer that is exposed while not overlapping the conductor pattern may include the step of removing the region of the adhesive layer using plasma.

In this case, the given pattern can be easily formed on the adhesive layer regardless of whether the adhesive layer is photosensitive or non-photosensitive.

(10) The step of forming the conductor pattern may include the step of etching the conductor pattern by wet etching.

In this case, the given pattern can be easily formed on the conductor layer while an etching solution is prevented from adhering to the insulating layer.

(11) The insulating layer may include a porous material. In this case, the insulating layer is air-permeable. This allows the printed circuit board to be used as an electrode of a fuel cell.

(12) The step of forming the conductor pattern may include the steps of forming a laminated structure of the support layer, the conductor layer and an adhesive layer, and forming the conductor pattern having the given pattern on the one surface of the support layer and forming an adhesive pattern having the given pattern on the conductor pattern by dividing respective unnecessary portions of the conductor layer and the adhesive layer from the laminated structure, and the step of joining the insulating layer onto the conductor pattern may include the step of joining the insulating layer onto the conductor pattern with the adhesive pattern sandwiched between the insulating layer and the conductor pattern.

In this case, the respective unnecessary portions of the conductor layer and the adhesive layer are separated from the laminated structure of the support layer, the conductor layer and the adhesive layer. This allows the conductor pattern and the adhesive pattern to be simultaneously formed on the one surface of the support layer. As a result, manufacturing steps and cost can be reduced.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWINGS

FIG. 1(a) is a plan view of an FPC board manufactured by a method of manufacturing the FPC board according to a first embodiment, and FIG. 1(b) is a sectional view of the FPC board taken along the line A-A of FIG. 1(a), FIGS. 2(a) to (d) are sectional views for use in illustrating steps in the method of manufacturing the FPC board.

DETAILED DESCRIPTION OF THE INVENTION

[1] First Embodiment

Figure 2:
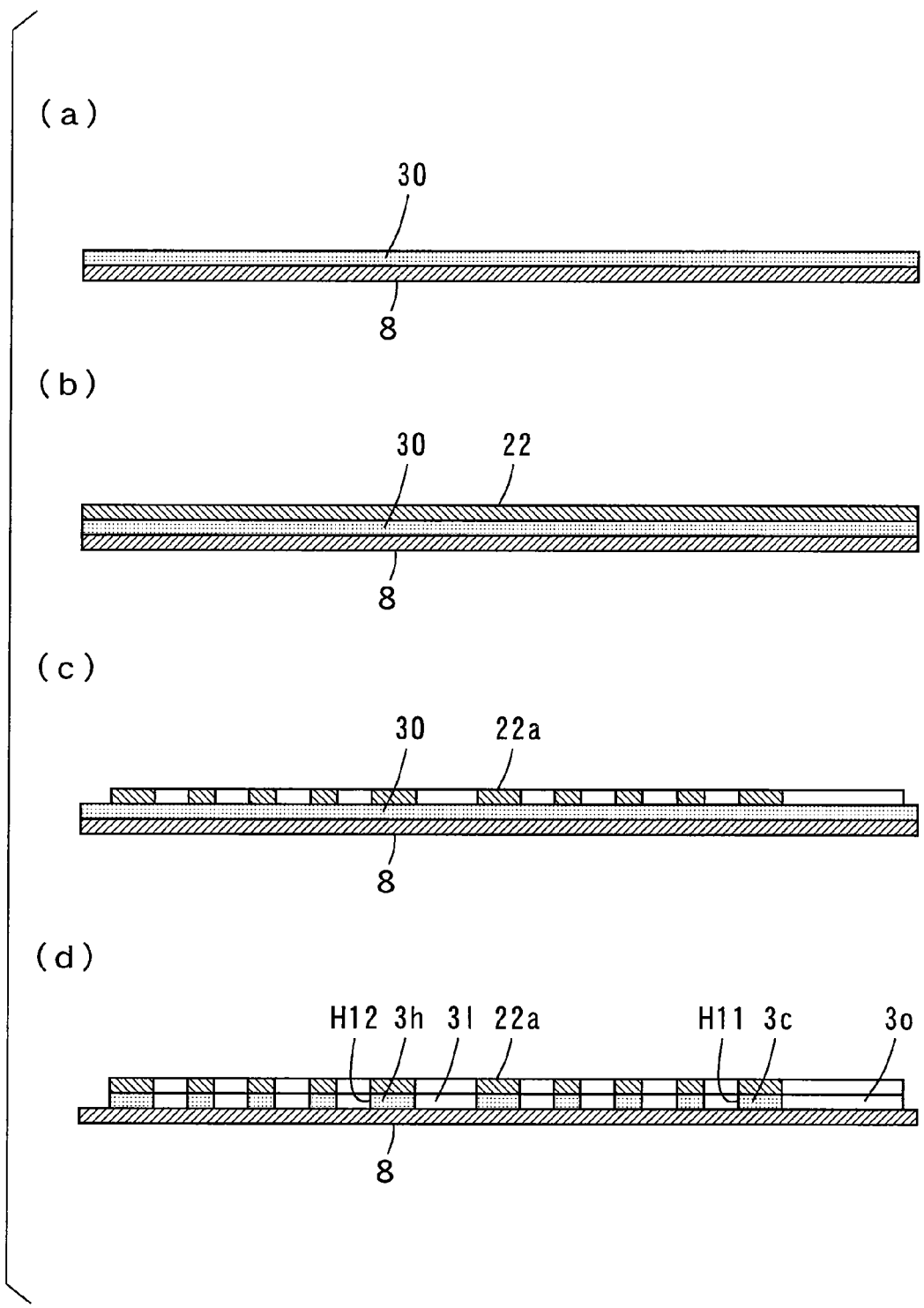

Description will be made of a method of manufacturing a printed circuit board according to a first embodiment while referring to the drawings. In the present embodiment, a flexible printed circuit board (hereinafter abbreviated as an FPC board) having flexibility is described as an example of the printed circuit board. The FPC board can be used in a fuel cell, for example, as described below.

(1) Configuration of the FPC Board

FIG. 1(a) is a plan view of the FPC board manufactured by the method of manufacturing the FPC board according to the first embodiment, and FIG. 1(b) is a sectional view of the FPC board taken along the line A-A of FIG. 1(a).

As shown in FIGS. 1(a) and (b), the FPC board 1 includes a base insulating layer 2 made of porous ePTFE (expanded polytetrafluoroethylene), for example. This causes the base insulating layer 2 to be air-permeable. The base insulating layer 2 is composed of a first insulating portion 2a, a second insulating portion 2b, a third insulating portion 2c and a fourth insulating portion 2d. The first insulating portion 2a and the second insulating portion 2b each have a rectangular shape, and integrally formed while being adjacent to each other. Hereinafter, sides that are parallel to a border line between the first insulating portion 2a and the second insulating portion 2b are referred to as lateral sides, and a pair of sides that are perpendicular to the lateral sides of the first insulating portion 2a and the second insulating portion 2b are referred to as end sides.

The third insulating portion 2c is formed to extend outward from part of the lateral side at a corner of the first insulating portion 2a. The fourth insulating portion 2d is formed to extend outward from part of the lateral side at a corner of the second insulating portion 2b on the diagonal position of the foregoing corner of the first insulating portion 2a.

A bend portion B1 is provided on the border line between the first insulating portion 2a and the second insulating portion 2b so as to divide the base insulating layer 2 into two substantially equal parts. As will be described below, the base insulating layer 2 can be bent along the bend portion B1. The bend portion B1 may be a shallow groove with a line shape, a mark with a line shape or the like, for example. Alternatively, there may be nothing at the bend portion B1 if the base insulating layer 2 can be bent at the bend portion B1. When the base insulating layer 2 is bent along the bend portion B1, the first insulating portion 2a and the second insulating portion 2b are opposite to each other. In this case, the third insulating portion 2c and the fourth insulating portion 2d are not opposite to each other.

Rectangular collector portions 3a, 3b, 3c, 3d, 3e, 3f, 3g, 3h, 3i, 3j, connection conductor portions 3k, 3l, 3m, 3n and drawn-out conductor portions 3o, 3p are formed on one surface of the base insulating layer 2 with an adhesive pattern 7 of FIG. 1(b) sandwiched therebetween. The collector portions 3a to 3j, the connection conductor portions 3k to 3n and the drawn-out conductor portions 3o, 3p are made of copper, for example.

Any adhesive such as an epoxy resin adhesive, a phenolic resin adhesive, a polyester resin adhesive, an acrylic resin adhesive or a polyimide adhesive is used as the adhesive pattern 7. In the present embodiment, a photo-acid generating agent is added to the adhesive pattern 7, thus causing the adhesive pattern 7 to be photosensitive.

Each of the collector portions 3a to 3j has a rectangular shape. The collector portions 3a to 3e extend parallel to the end sides of the first insulating portion 2a, and arranged along a direction of the lateral sides of the first insulating portion 2a. Similarly, the collector portions 3f to 3j extend parallel to the end sides of the second insulating portion 2b, and arranged along a direction of the lateral sides of the second insulating portion 2b. In this case, the collector portions 3a to 3e and the collector portions 3f to 3j are symmetrically arranged with respect to the bend portion B1.

Each of the connection conductor portions 3k to 3n is formed on the first insulating portion 2a and the second insulating portion 2b so as to cross the bend portion B1. The connection conductor portion 3k electrically connects the collector portion 3b and the collector portion 3f to each other, the connection conductor portion 3l electrically connects the collector portion 3c and the collector portion 3g to each other, the connection conductor portion 3m electrically connects the collector portion 3d and the collector portion 3h to each other, and the connection conductor portion 3n electrically connects the collector portion 3e and the collector portion 3i to each other.

A plurality of (four in this example) openings H11 are formed along a direction of the end sides in each of the collector portions 3a to 3e. A plurality of (four in this example) openings H12 are formed along the direction of the end sides in each of the collector portions 3f to 3j.

The drawn-out conductor portion 3o is formed to linearly extend from an outer short side of the collector portion 3a to the third insulating portion 2c. The drawn-out conductor portion 3p is formed to linearly extend from an outer short side of the collector portion 3j to the fourth insulating portion 2d.

A cover layer 6a is formed on the first insulating portion 2a to cover the collector portion 3a and part of the drawn-out conductor potion 3o. Thus, the tip of the drawn-out conductor portion 3o is exposed while not covered with the cover layer 6a. The exposed portion of the drawn-out conductor portion 3o is referred to as a drawn-out electrode 5a. Cover layers 6b, 6c, 6d, 6e are formed on the first insulating portion 2a to cover the collector portions 3b to 3e, respectively. The cover layers 6a to 6e come in contact with an upper surface of the first insulating portion 2a inside the openings H11 of the collector portions 3a to 3e, respectively.

A cover layer 6j is formed on the second insulating portion 2b to cover the collector portion 3j and part of the drawn-out conductor potion 3p. Thus, the tip of the drawn-out conductor portion 3p is exposed while not covered with the cover layer 6j. The exposed portion of the drawn-out conductor portion 3p is referred to as a drawn-out electrode 5b. Cover layers 6f, 6g, 6h, 6i are formed on the second insulating portion 2b to cover the collector portions 3f to 3i, respectively. The cover layers 6f to 6j come in contact with an upper surface of the second insulating portion 2b inside the openings H12 of the collector portions 3f to 3j, respectively.

Cover layers 6k, 6l, 6m, 6n are formed on the first insulating portion 2a and the second insulating portion 2b to cover the connection conductor portions 3k to 3n, respectively. Each of the cover layers 6a to 6n is made of a resin composition containing a conductive material.

For example, phenolic resin, epoxy resin, acrylic resin, polyurethane resin, polyimide resin, polyamide imide resin, polyester resin or a mixture of at least two types of the foregoing resin can be used as the resin composition.

The resin composition preferably has moisture permeability of not more than 150 g/(m$^2$·24 h) in an environment at a temperature of 40° C. and with a relative humidity of 90%. The resin composition preferably has a glass transition temperature Tg of not less than 60° C.

Meanwhile, a metal material such as gold (Au), silver or silver nanoparticles, a carbon material such as carbon black, graphite or carbon nanotube, a conductive polymeric material such as polythiophene or polyaniline, or a mixture of at least two types of the foregoing materials can be used as the conductive material, for example.

(2) The Method of Manufacturing the FPC Board

Figure 3:
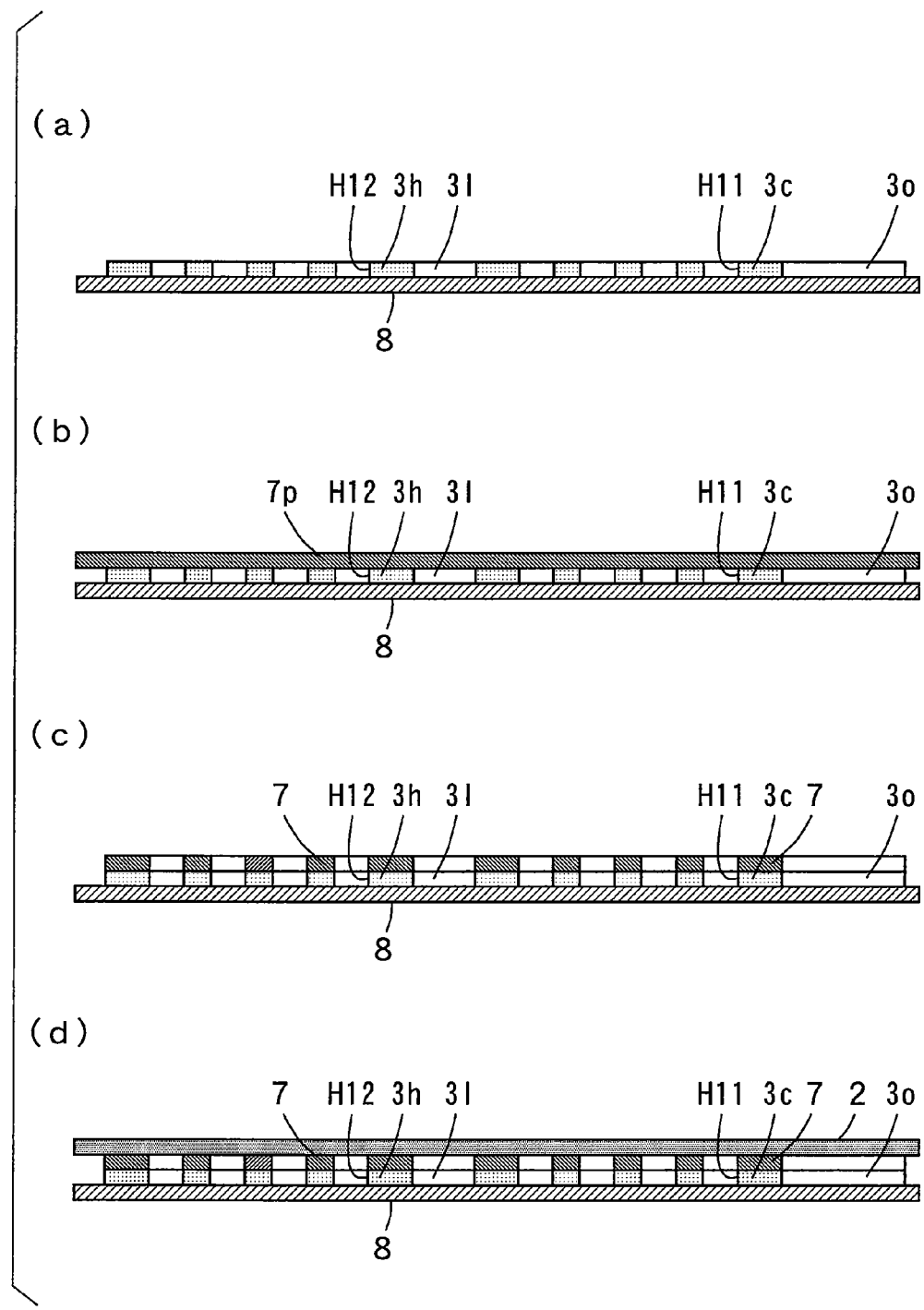
FIGS. 3(a) to (d) are sectional views for use in illustrating steps in the method of manufacturing the FPC board.
Figure 4:
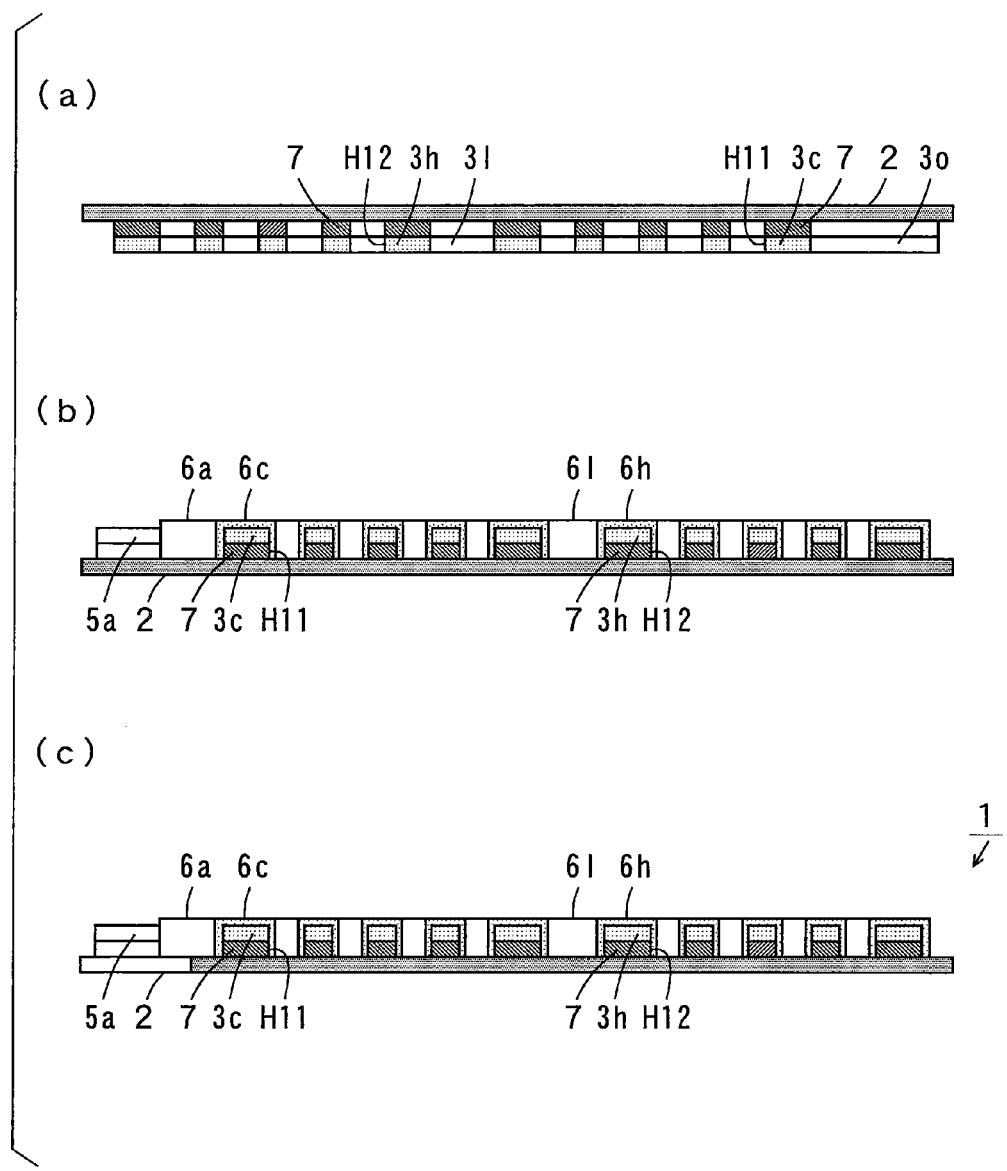
FIGS. 4(a) to (c) are sectional views for use in illustrating steps in the method of manufacturing the FPC board.

Next, description is made of the method of manufacturing the FPC board 1 shown in FIG. 1. FIGS. 2, 3 and 4 show sectional views, which correspond to the sectional view taken along the line A-A of FIG. 1, for use in illustrating steps in the method of manufacturing the FPC board 1.

First, a two-layer base material composed of a carrier layer 8 and a conductor layer 30 is prepared as shown in FIG. 2(a). Resin such as PET (polyethylene terephthalate) having a pressure sensitive adhesive layer or a thin metal film such as stainless steel having a pressure sensitive adhesive layer can be used as the carrier layer 8. The conductor layer 30 is made of copper, for example. The carrier layer 8 and the conductor layer 30 may be attached to each other by a laminator or subjected to contact bonding by a pressing machine. Contact bonding of the carrier layer 8 and the conductor layer 30 may be performed in a heated state or a vacuum state.

As shown in FIG. 2(b), a resist film 22 is formed of a photosensitive dry film resist or the like on the conductor layer 30. As shown in FIG. 2(c), the resist film 22 is exposed in a given pattern, followed by development, thereby forming an etching resist pattern 22a.

Next, a region of the conductor layer 30 that is exposed while not covered with the etching resist pattern 22a is removed by etching using ferric chloride as shown in FIG. 2(d). The etching resist pattern 22a is then removed by a stripping solution as shown in FIG. 3(a). Thus, the collector portions 3a to 3j, the connection conductor portions 3k to 3n and the drawn-out conductor portions 3o, 3p (see FIG. 1(a)) are formed on the carrier layer 8. The plurality of openings H11 are formed in the collector portions 3a to 3e, and the plurality of openings H12 are formed in the collector portions 3f to 3j.

The collector portions 3a to 3j, the connection conductor portions 3k to 3n and the drawn-out conductor portions 3o, 3p may be formed on the carrier layer 8 by another method such as sputtering, evaporation or plating.

Then, an adhesive layer precursor 7p is applied on the entire surface including the top surfaces (surfaces not in contact with the carrier layer 8) of the collector portions 3a to 3j, the connection conductor portions 3k to 3n and the drawn-out conductor portions 3o, 3p as shown in FIG. 3(b). As shown in FIG. 3(c), the adhesive layer precursor 7p is exposed with a given mask pattern sandwiched therebetween, followed by development, so that the adhesive pattern 7 having the given pattern is formed on the collector portions 3a to 3j, the connection conductor portions 3k to 3n and the drawn-out conductor portions 3o, 3p.

When the adhesive layer precursor 7p is negative photosensitive, the adhesive layer precursor 7p is exposed with the mask pattern having an inverted shape of the collector portions 3a to 3j, the connection conductor portions 3k to 3n and the drawn-out conductor portions 3o, 3p sandwiched therebetween. When the adhesive layer precursor 7p is positive photosensitive, the adhesive layer precursor 7p is exposed with the mask pattern having the same shape as the collector portions 3a to 3j, the connection conductor portions 3k to 3n and the drawn-out conductor portions 3o, 3p sandwiched therebetween.

When the adhesive layer precursor 7p is positive photosensitive, the adhesive layer precursor 7p may be exposed from its lower surface (surface in contact with the collector portions 3a to 3j, the connection conductor portions 3k to 3n and the drawn-out conductor portions 3o, 3p). In this case, the collector portions 3a to 3j, the connection conductor portions 3k to 3n and the drawn-out conductor portions 3o, 3p can be used as the mask pattern, thus eliminating the need to use a separate mask pattern. This results in reduction in manufacturing steps and cost of the FPC board 1. Note that the carrier layer 8 made of PET transmits exposure light, and therefore does not inhibit the adhesive layer precursor 7p from being exposed from its lower surface (surface in contact with the collector portions 3a to 3j, the connection conductor portions 3k to 3n and the drawn-out conductor portions 3o, 3p).

The applied adhesive layer precursor 7p excluding its portions on the collector portions 3a to 3j, the connection conductor portions 3k to 3n and the drawn-out conductor portions 3o, 3p may be removed by a chemical solution, laser light or plasma processing. In this case, the mask pattern may not be used in exposure of the adhesive layer precursor 7p. Similarly, the adhesive layer precursor 7p may be applied only on the collector portions 3a to 3j, the connection conductor portions 3k to 3n and the drawn-out conductor portions 3o, 3p by screen printing or a paste dispenser. Also in this case, the mask pattern may not be used in exposure of the adhesive layer precursor 7p.

Next, the base insulating layer 2 is joined onto the collector portions 3a to 3j, the connection conductor portions 3k to 3n and the drawn-out conductor portions 3o, 3p with the adhesive pattern 7 sandwiched therebetween as shown in FIG. 3(d). The carrier layer 8 is subsequently separated from the collector portions 3a to 3j, the connection conductor portions 3k to 3n and the drawn-out conductor portions 3o, 3p as shown in FIG. 4(a).

Then, the cover layers 6a to 6n (see FIG. 1(a)) are formed by application or lamination on the base insulating layer 2 to cover the collector portions 3a to 3j, the connection conductor portions 3k to 3n and the drawn-out conductor portions 3o, 3p as shown in FIG. 4(b). Here, the drawn-out electrodes 5a, 5b (see FIG. 1(a)) are exposed while not covered with the cover layers 6a, 6j. The top-to-bottom direction in the sectional views of FIGS. 4(b) and (c) is the reverse of that in the sectional view of FIG. 4(a).

Finally, the base insulating layer 2 is cut in a given shape, so that the FPC board 1 including the base insulating layer 2, the collector portions 3a to 3j, the connection conductor portions 3k to 3n, the drawn-out conductor portions 3o, 3p and the cover layers 6a to 6n is completed as shown in FIG. 4(c).

The thickness of the carrier layer 8 is preferably not less than 1 μm and not more than 500 μm, more preferably not less than 10 μm and not more than 200 μm, and further preferably not less than 25 μm and not more than 150 μm. The carrier layer 8 having the thickness of not less than 1 μm improves its handleability, and the carrier layer 8 having the thickness of not more than 500 μm improves its flexibility.

The thickness of the conductor layer 30 is preferably not less than 1 μm and not more than 100 μm, more preferably not less than 5 μm and not more than 70 μm, and further preferably not less than 10 μm and not more than 50 μm. The conductor layer 30 having the thickness of not less than 1 μm improves electrical characteristics of resistances or the like, and the conductor layer 30 having the thickness of not more than 100 μm improves its handleability.

The thickness of the adhesive pattern 7 is preferably not less than 1 μm and not more than 100 μm, more preferably not less than 5 μm and not more than 70 μm, and further preferably not less than 10 μm and not more than 50 μm. The adhesive pattern 7 having the thickness of not less than 1 μm improves the adhesive force of the adhesive, and the adhesive pattern 7 having the thickness of not more than 100 μm improves its handleability.

The thickness of the base insulating layer 2 is preferably not less than 10 μm and not more than 500 μm, more preferably not less than 10 μm and not more than 200 μm, and further preferably not less than 10 μm and not more than 100 μm. The base insulating layer 2 having the thickness of not less than 10 μm improves its handleability, and the base insulating layer 2 having the thickness of not more than 500 μm reduces its cost.

While the FPC board 1 is manufactured by a subtractive method in FIGS. 2 to 4, the present invention is not limited to this. For example, another manufacturing method such as a semi-additive method may be used.

(3) Fuel Cell Using the FPC Board

Figure 5:
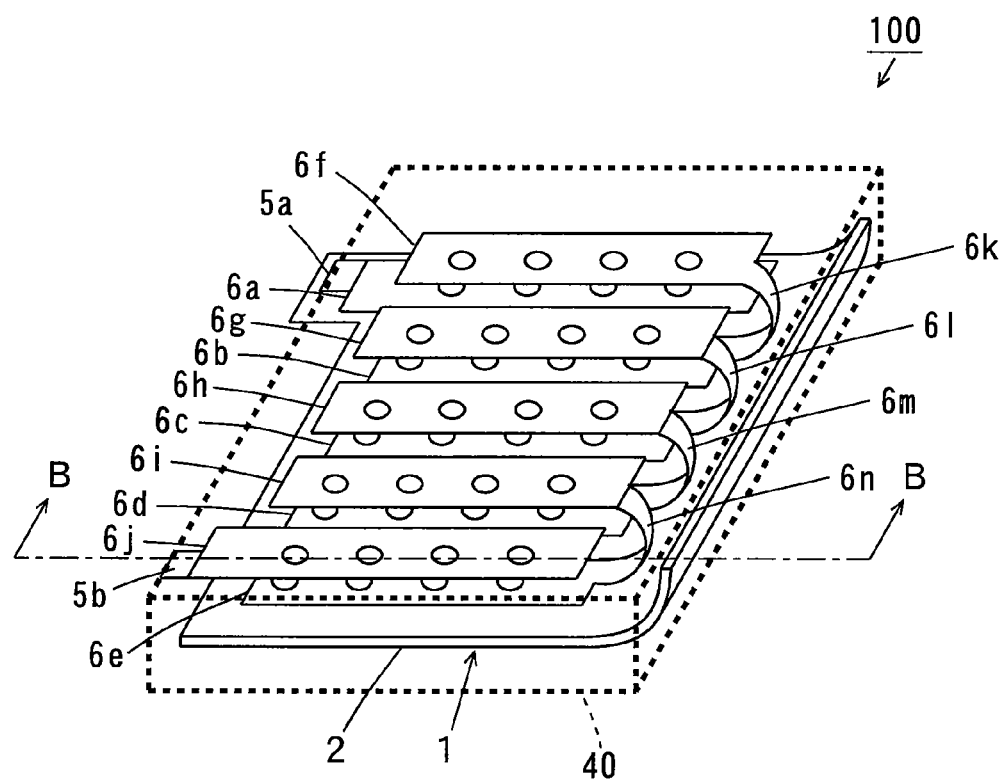
FIG. 5 is an external perspective view of a fuel cell using the FPC board.
Figure 6:
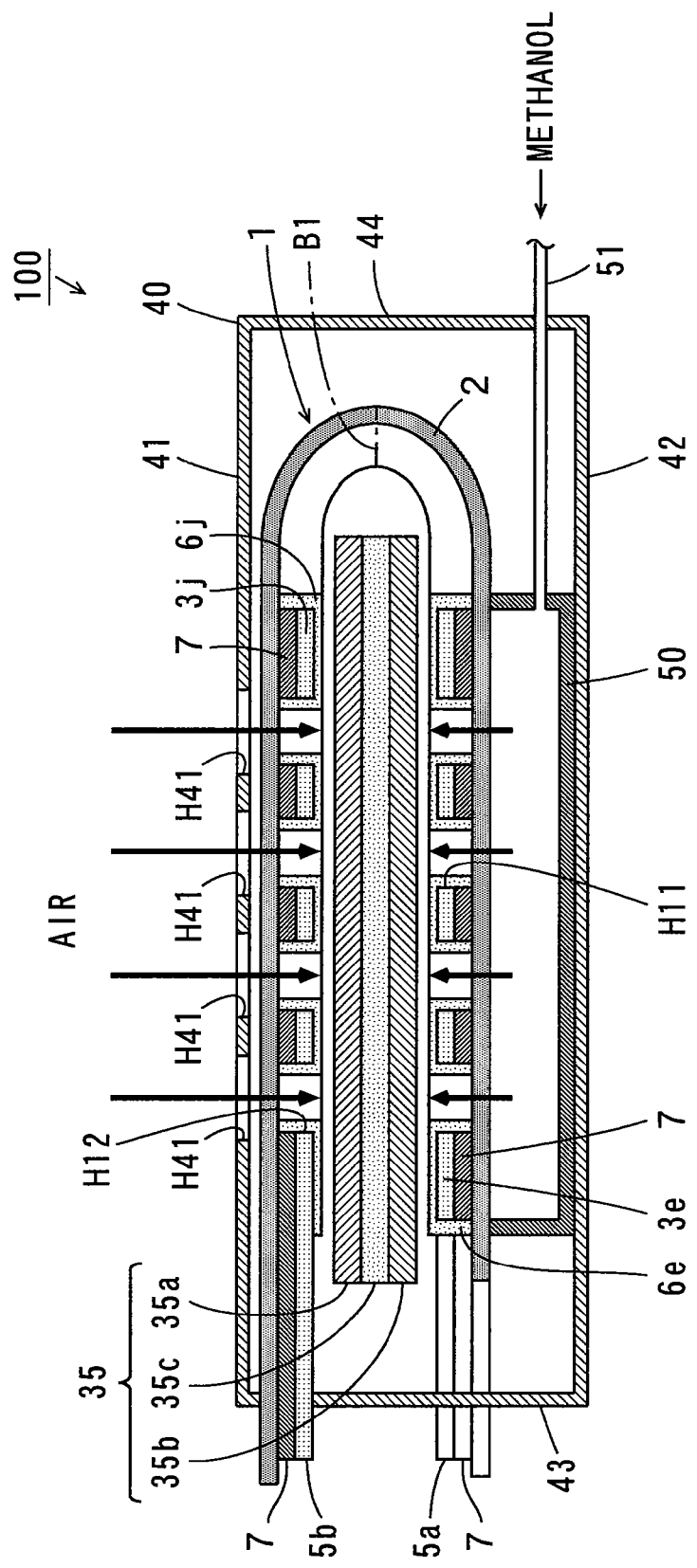
FIG. 6 is a diagram for use in illustrating functions in the fuel cell.

FIG. 5 is an external perspective view of a fuel cell 100 using the FPC board 1. FIG. 6 is a diagram for use in illustrating functions in the fuel cell 100, and is a sectional view taken along the line B-B of the fuel cell 100 of FIG. 5.

As shown in FIGS. 5 and 6, the fuel cell 100 has a casing 40 having a rectangular parallelpiped shape. The casing 40 is indicated by the broken lines in FIG. 5. The casing 40 has an upper surface portion 41, a lower surface portion 42, one side surface portion 43 and the other side surface portion 44. FIG. 6 does not show the remaining pair of side surface portions.

The FPC board 1 is sandwiched between the upper surface portion 41 and the lower surface portion 42 of the casing 40 while being bent along the bend portion B1 of FIG. 1 such that the one surface, on which the cover layers 6a to 6n are formed, is positioned on an inner side.

The drawn-out electrodes 5a, 5b of the FPC board 1 are drawn out from the one side surface portion 43 of the casing 40 to the outside. Terminals of various external circuits are electrically connected to the drawn-out electrodes 5a, 5b.

Inside the casing 40, a plurality of (five in the present embodiment) electrode films 35 are arranged between the cover layer 6a and the cover layer 6f, between the cover layer 6b and the cover layer 6g, between the cover layer 6c and the cover layer 6h, between the cover layer 6d and the cover layer 6i, and between the cover layer 6e and the cover layer 6j, respectively, of the bent FPC board 1 (see FIG. 1(a)). This causes the plurality of electrode films 35 to be connected in series.

Each electrode film 35 is composed of an air electrode 35a, a fuel electrode 35b and an electrolyte film 35c. The air electrode 35a is formed on one surface of the electrolyte film 35c, and the fuel electrode 35b is formed on the other surface of the electrolyte film 35c. The air electrodes 35a of the plurality of electrode films 35 are opposite to the cover layers 6f to 6j of the FPC board 1, respectively, and the fuel electrodes 35b of the plurality of electrode films 35 are opposite to the cover layers 6a to 6e of the FPC board 1, respectively.

A plurality of openings H41 are formed on the upper surface portion 41 of the casing 40 to correspond to the plurality of openings H12, respectively, of the collector portions 3f to 3j. Air is supplied to the air electrodes 35a of the electrode films 35 through the plurality of openings H41 of the casing 40, the air-permeable base insulating layer 2 of the FPC board 1 and the plurality of openings H12 of the collector portions 3f to 3j.

A fuel accommodating chamber 50 is provided at the lower surface portion 42 of the casing 40 to come in contact with the first insulating portion 2a (see FIG. 1(a)) of the base insulating layer 2. One end of a fuel supply pipe 51 is connected to the fuel accommodating chamber 50. The other end of the fuel supply pipe 51 is connected to a fuel supplier (not shown) in the outside through the other side surface portion 44 of the casing 40. Fuel is supplied from the fuel supplier to the fuel accommodating chamber 50 through the fuel supply pipe 51. The fuel is supplied to the fuel electrodes 35b of the electrode films 35 through the air-permeable base insulating layer 2 of the FPC board 1 and the plurality of openings H11 of the collector portions 3a to 3e. In the present embodiment, methanol is used as the fuel.

In the above-described configuration, methanol is decomposed into hydrogen ions and carbon dioxide in the plurality of fuel electrodes 35b, forming electrons. The formed electrons are led from the collector portion 3a (see FIG. 1) to the drawn-out electrode 5a of the FPC board 1. Hydrogen ions decomposed from methanol permeate through the electrolyte films 35c to reach the air electrodes 35a. In the plurality of air electrodes 35a, hydrogen ions and oxygen are reacted while electrons led from the drawn-out electrode 5b to the collector portion 3j are consumed, thereby forming water. In this manner, electrical power is supplied to the external circuits connected to the drawn-out electrodes 5a, 5b.

(4) Effects

In the method of manufacturing the FPC board 1 according to the present embodiment, the base insulating layer 2 does not exist when the collector portions 3a to 3j, the connection conductor portions 3k to 3n and the drawn-out conductor portions 3o, 3p are formed, and the base insulating layer 2 is joined onto the collector portions 3a to 3j, the connection conductor portions 3k to 3n and the drawn-out conductor portions 3o, 3p after the collector portions 3a to 3j, the connection conductor portions 3k to 3n and the drawn-out conductor portions 3o, 3p are formed. Therefore, the base insulating layer 2 is prevented from being dissolved or deformed by the chemical solution such as an etching solution because of the formation of the collector portions 3a to 3j, the connection conductor portions 3k to 3n and the drawn-out conductor portions 3o, 3p. This does not limit the type of the material used for the base insulating layer 2. As a result, the base insulating layer 2 can be formed using various materials depending on uses.

The base insulating layer 2 is joined onto the collector portions 3a to 3j, the connection conductor portions 3k to 3n and the drawn-out conductor portions 3o, 3p with the adhesive pattern 7 sandwiched therebetween, thus reliably preventing the collector portions 3a to 3j, the connection conductor portions 3k to 3n and the drawn-out conductor portions 3o, 3p from being separated from the base insulating layer 2.

In the FPC board 1 according to the present embodiment, since the base insulating layer 2 is made of the air-permeable porous material, the base insulating layer 2 can be used as a vapor-liquid separation membrane of the fuel cell 100, and the FPC board 1 can be used as the electrode of the fuel cell 100.

Since the adhesive pattern 7 has the same shape as the collector portions 3a to 3j, the connection conductor portions 3k to 3n and the drawn-out conductor portions 3o, 3p, the adhesive pattern 7 is not formed in a region of the base insulating layer 2 that is exposed while not overlapping the collector portions 3a to 3j, the connection conductor portions 3k to 3n and the drawn-out conductor portions 3o, 3p. This prevents flexibility of the FPC board 1 from being degraded. Furthermore, when air and vaporized methanol permeate the base insulating layer 2 to be supplied to the air electrode 35a and the fuel electrode 35b, permeation of the air and vaporized methanol is not inhibited by the adhesive layer.

The cover layers 6a to 6n are formed on the base insulating layer 2 to cover the collector portions 3a to 3j, the connection conductor portions 3k to 3n and the drawn-out conductor portions 3o, 3p, and the adhesive pattern 7 is formed between the base insulating layer 2 and the collector portions 3a to 3j, between the base insulating layer 2 and the connection conductor portions 3k to 3n, and between the base insulating layer 2 and the drawn-out conductor portions 3o, 3p. This prevents acid such as methanol from coming in contact with the collector portions 3a to 3j, the connection conductor portions 3k to 3n and the drawn-out conductor portions 3o, 3p. As a result, the collector portions 3a to 3j, the connection conductor portions 3k to 3n and the drawn-out conductor portions 3o, 3p are prevented from corroding.

Since the adhesive layer precursor 7p is photosensitive, the adhesive pattern 7 can be easily formed by performing the exposure processing and the development processing in the present embodiment.

According to the method of manufacturing the FPC board 1 according to the present embodiment, a base insulating layer 2 made of a transparent material can be also used. In this case, the FPC board 1 can be used as an electrode of a solar battery.

[2] Second Embodiment

Figure 7:
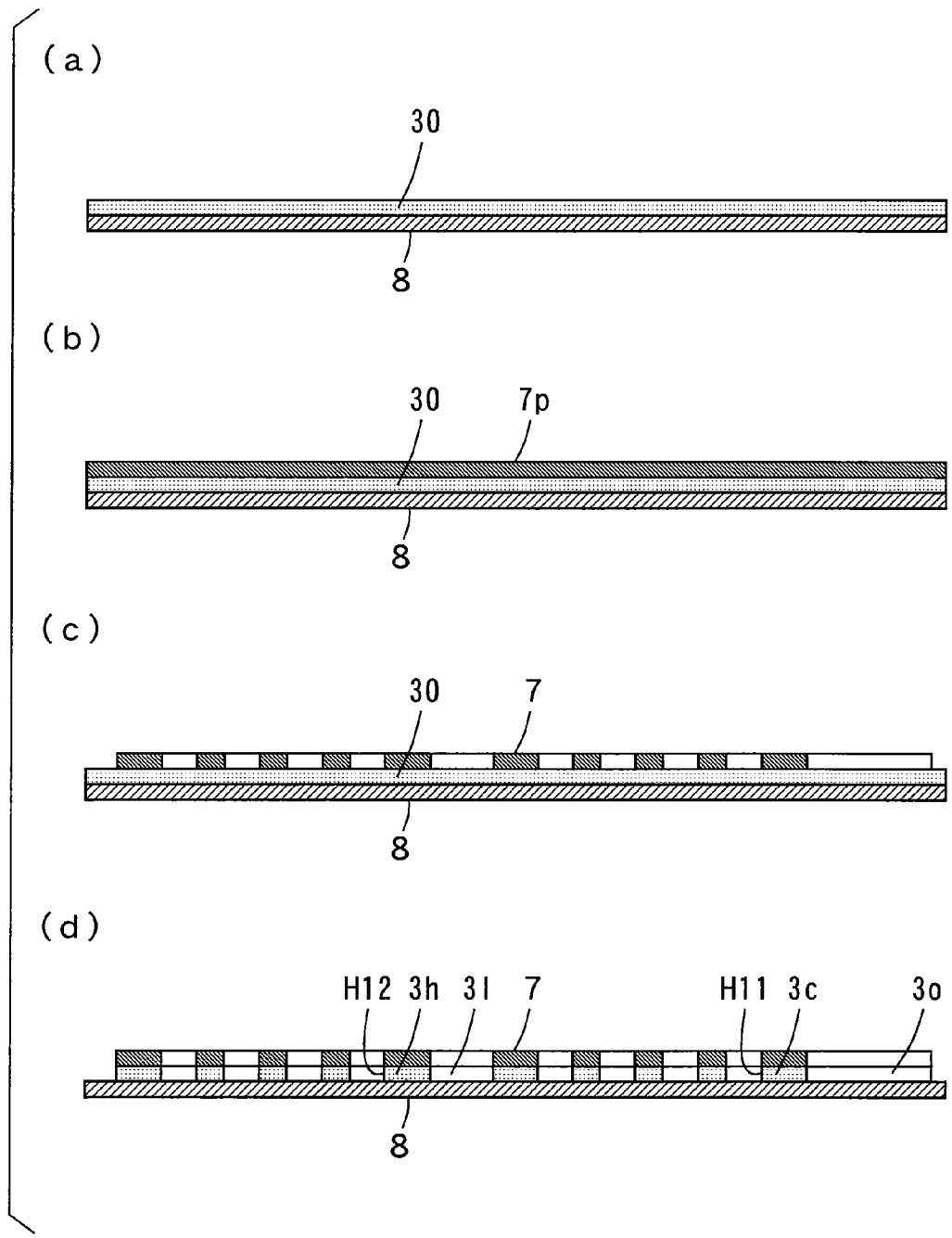
FIGS. 7(a) to (d) are sectional views for use in illustrating steps in a method of manufacturing an FPC board according to a second embodiment.
Figure 8:
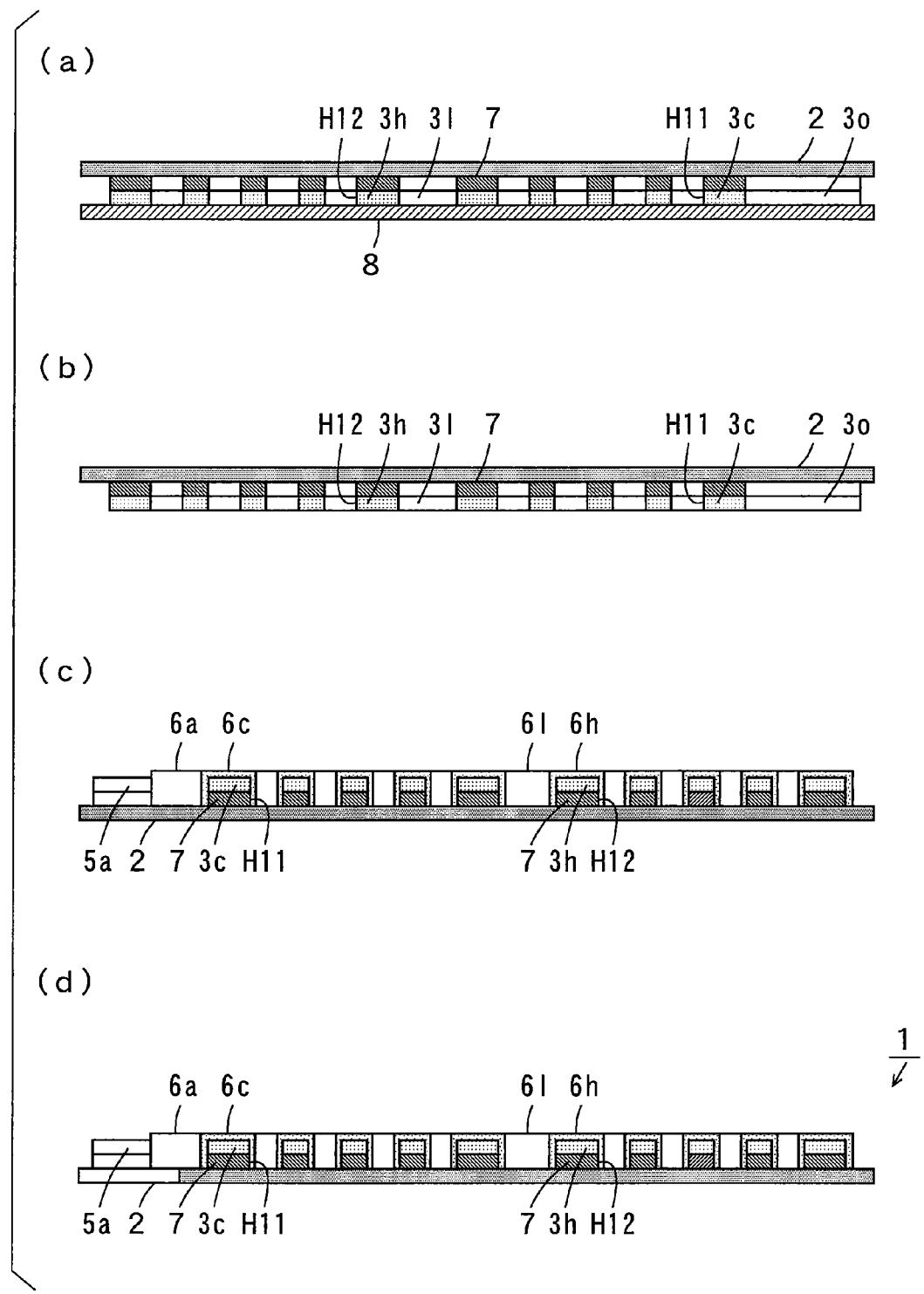
FIGS. 8(a) to (d) are sectional views for use in illustrating steps in the method of manufacturing the FPC board according to the second embodiment.

Description will be made of a method of manufacturing the FPC board 1 according to a second embodiment by referring to differences from the method of manufacturing the FPC board 1 according to the first embodiment. FIGS. 7 and 8 show sectional views for use in illustrating steps in the method of manufacturing the FPC board 1 according to the second embodiment.

First, the two-layer base material composed of the carrier layer 8 and the conductor layer 30 is prepared as shown in FIG. 7(a). Next, the adhesive layer precursor 7p is applied onto the conductor layer 30 as shown in FIG. 7(b). The adhesive layer precursor 7p is exposed with the mask pattern having the same shape as the collector portions 3a to 3j, the connection conductor portions 3k to 3n and the drawn-out conductor portions 3o, 3p of FIG. 1(a) sandwiched therebetween, followed by development, so that the adhesive pattern 7 having the given pattern is formed on the conductor layer 30 as shown in FIG. 7(c).

As shown in FIG. 7(d), the region of the conductor layer 30 that is exposed while not covered with the adhesive pattern 7 is subsequently removed by etching using ferric chloride. Thus, the collector portions 3a to 3j, the connection conductor portions 3k to 3n and the drawn-out conductor portions 3o, 3p (see FIG. 1(a)) are formed on the carrier layer 8. The plurality of openings H11 are formed in the collector portions 3a to 3e, and the plurality of openings H12 are formed in the collector portions 3f to 3j.

Then, the base insulating layer 2 is joined onto the collector portions 3a to 3j, the connection conductor portions 3k to 3n and the drawn-out conductor portions 3o, 3p with the adhesive pattern 7 sandwiched therebetween as shown in FIG. 8(a). After that, the carrier layer 8 is separated from the collector portions 3a to 3j, the connection conductor portions 3k to 3n and the drawn-out conductor portions 3o, 3p as shown in FIG. 8(b).

The cover layers 6a to 6n (see FIG. 1(a)) are formed by application or lamination on the base insulating layer 2 to cover the collector portions 3a to 3j, the connection conductor portions 3k to 3n and the drawn-out conductor portions 3o, 3p as shown in FIG. 8(c). Here, the drawn-out electrodes 5a, 5b (see FIG. 1(a)) are exposed while not covered with the cover layers 6a, 6j. The top-to-bottom direction in the sectional views of FIGS. 8(c) and (d) is the reverse of that in the sectional view of FIG. 8(b).

Finally, the base insulating layer 2 is cut in the given shape, so that the FPC board 1 including the base insulating layer 2, the collector portions 3a to 3j, the connection conductor portions 3k to 3n, the drawn-out conductor portions 3o, 3p and the cover layers 6a to 6n is completed as shown in FIG. 8(d).

In the method of manufacturing the FPC board 1 according to the present embodiment, the adhesive pattern 7 is formed on the conductor layer 30 of the base material having the laminated structure of the carrier layer 8 and the conductor layer 30. The exposed region of the conductor layer 30 is removed using the adhesive pattern 7 as the mask. This allows the collector portions 3a to 3j, the connection conductor portions 3k to 3n and the drawn-out conductor portions 3o, 3p to be formed without separately preparing the mask pattern. This results in reduction in manufacturing steps and cost of the FPC board 1.

Since the adhesive pattern 7 is photosensitive, the adhesive pattern 7 can be easily formed by performing the exposure processing and the development processing.

[3] Third Embodiment

Figure 9:
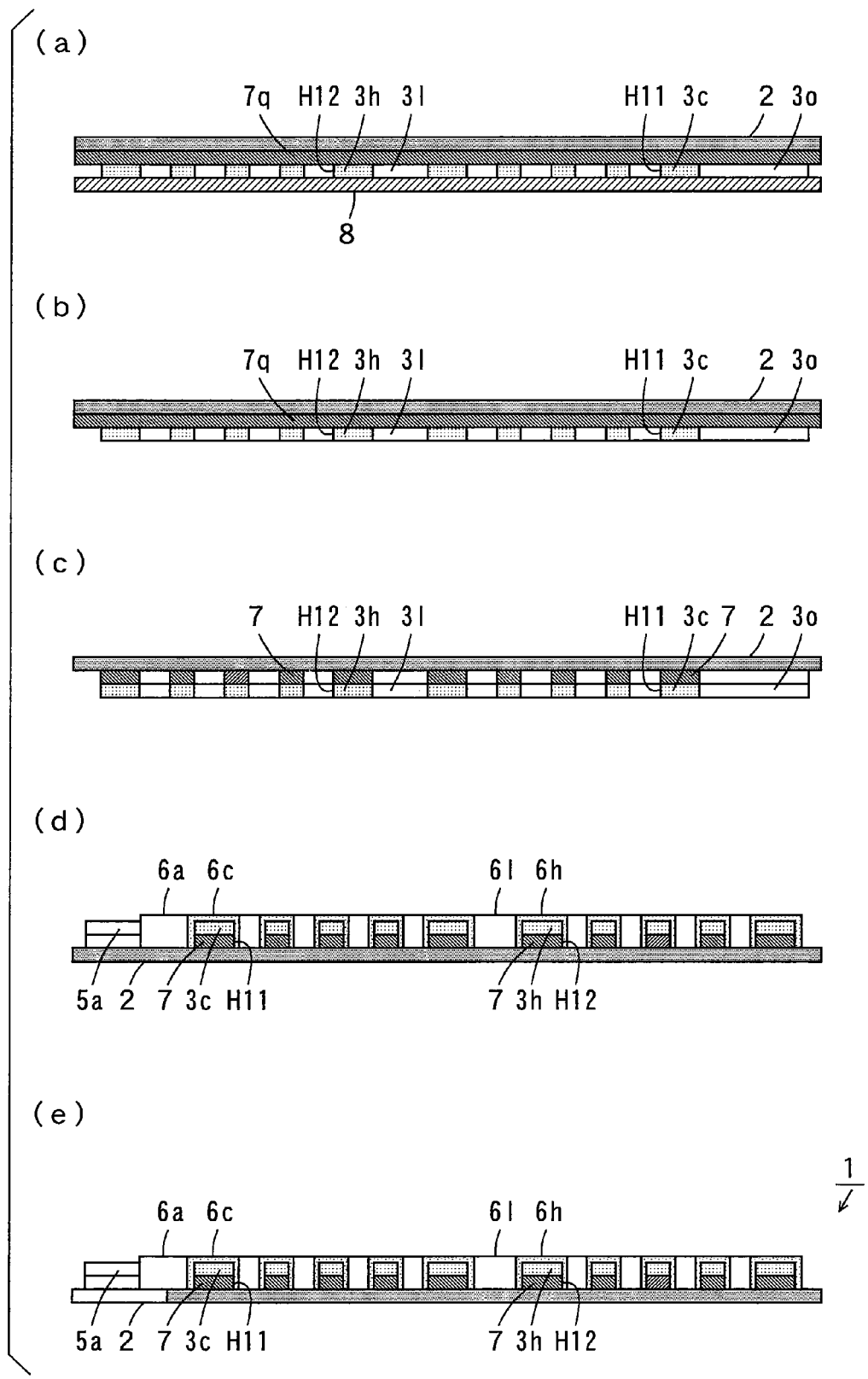
FIGS. 9(a) to (e) are sectional views for use in illustrating steps in a method of manufacturing an FPC board according to a third embodiment.

Description will be made of a method of manufacturing the FPC board 1 according to a third embodiment while referring to differences from the method of manufacturing the FPC board 1 according to the first embodiment. In the present embodiment, the adhesive pattern 7 is not photosensitive. FIG. 9 shows sectional views for use in illustrating steps in the method of manufacturing the FPC board 1 according to the third embodiment. The steps shown in FIG. 2(a) to FIG. 3(b) of the method of manufacturing the FPC board 1 according to the first embodiment also apply to the method of manufacturing the FPC board 1 according to the present embodiment.

After the step shown in FIG. 3(b), an adhesive layer 7q is formed by drying the adhesive layer precursor 7p, and the base insulating layer 2 is joined onto the collector portions 3a to 3j, the connection conductor portions 3k to 3n and the drawn-out conductor portions 3o, 3p with the adhesive layer 7q sandwiched therebetween as shown in FIG. 9(a). The carrier layer 8 is then separated from the collector portions 3a to 3j, the connection conductor portions 3k to 3n and the drawn-out conductor portions 3o, 3p as shown in FIG. 9(b). A region of the adhesive layer 7q that is exposed while not overlapping the collector portions 3a to 3j, the connection conductor portions 3k to 3n and the drawn-out conductor portions 3o, 3p is subsequently removed by plasma processing as shown in FIG. 9(c). In this manner, the adhesive pattern 7 is formed.

Next, the cover layers 6a to 6n (see FIG. 1(a)) are formed by application or lamination on the base insulting layer 2 to cover the collector portions 3a to 3j, the connection conductor portions 3k to 3n and the drawn-out conductor portions 3o, 3p as shown in FIG. 9(d). Here, the drawn-out electrodes 5a, 5b (see FIG. 1(a)) are exposed while not covered with the cover layers 6a, 6j. The top-to-bottom direction in the sectional views of FIGS. 9(d) and (e) is the reverse of that in the sectional view of FIG. 9(c).

Finally, the base insulating layer 2 is cut in the give shape, so that the FPC board 1 including the base insulating layer 2, the collector portions 3a to 3j, the connection conductor portions 3k to 3n, the drawn-out conductor portions 3o, 3p and the cover layers 6a to 6n is completed as shown in FIG. 9(e).

Since the collector portions 3a to 3j, the connection conductor portions 3k to 3n and the drawn-out conductor portions 3o, 3p can be used as the mask, the adhesive pattern 7 can be formed without separately preparing the mask pattern in the method of manufacturing the FPC board 1 according to the present embodiment. This results in reduction in the manufacturing steps and cost of the FPC board 1.

The adhesive pattern 7 is formed by the plasma processing. Therefore, the adhesive pattern 7 can be easily formed regardless of whether the adhesive layer precursor 7p is photosensitive or non-photosensitive.

[4] Fourth Embodiment

Figure 10:
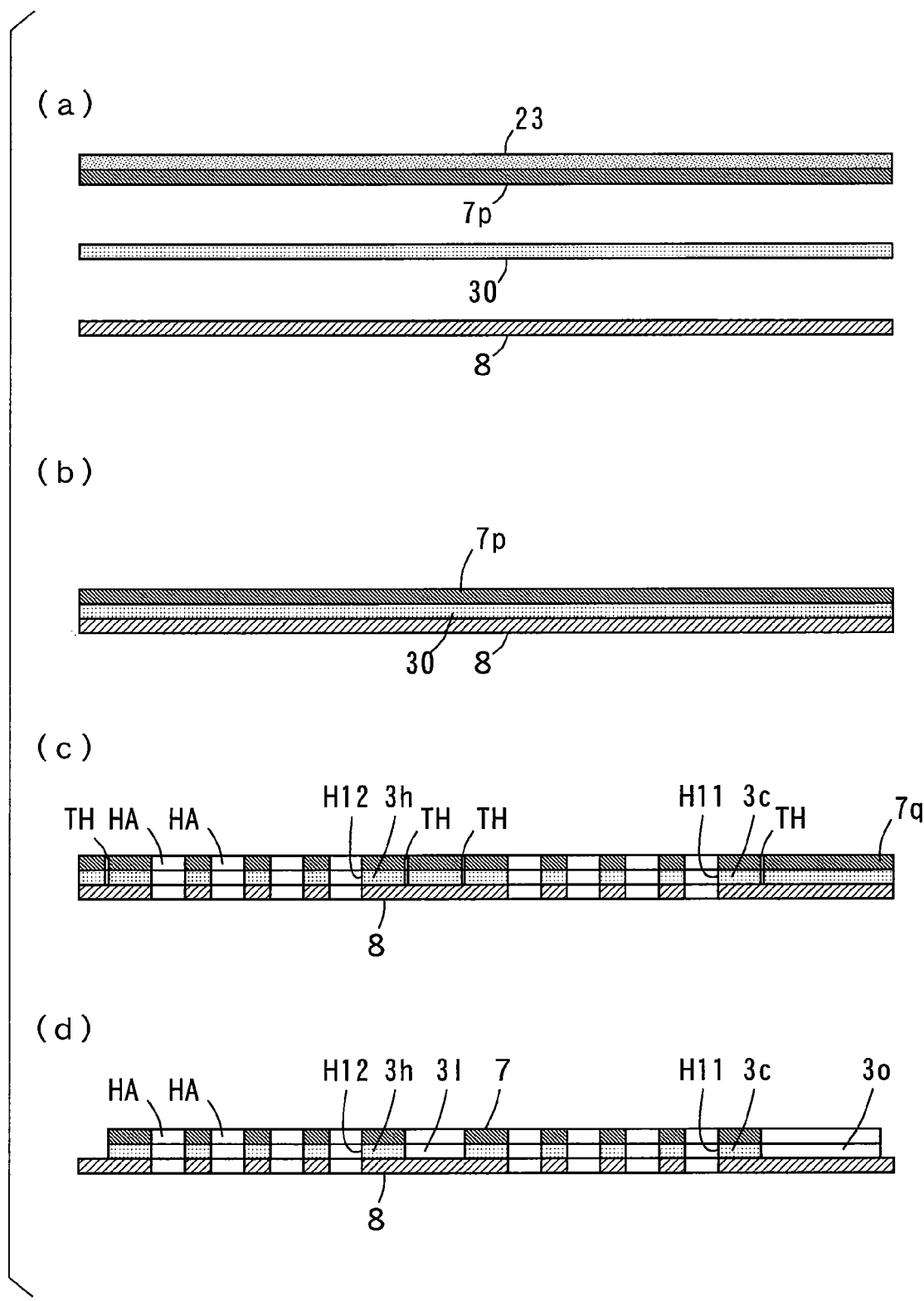
FIGS. 10(a) to (d) are sectional views for use in illustrating steps in a method of manufacturing an FPC board according to a fourth embodiment.
Figure 11:
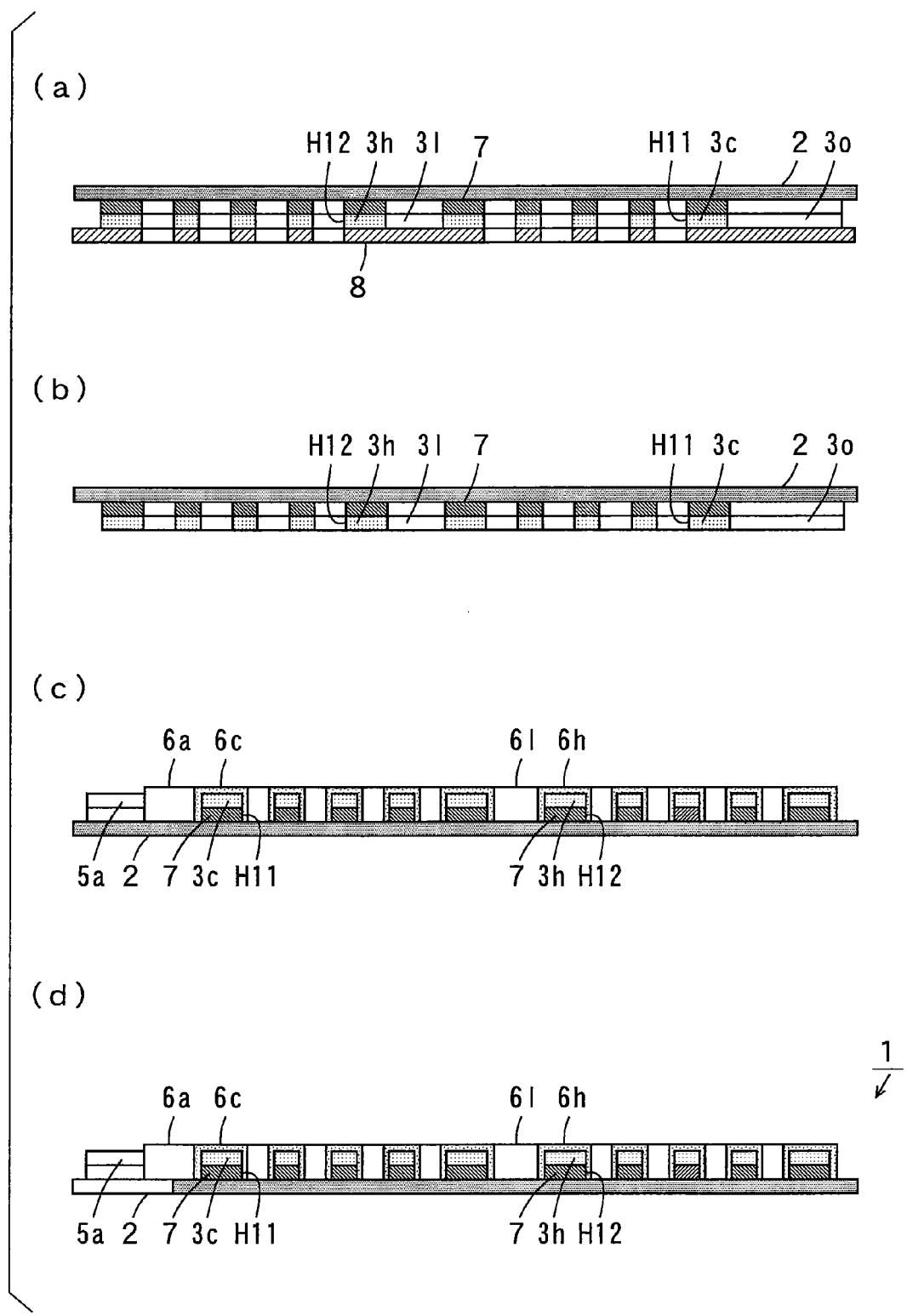
FIGS. 11(a) to (d) are sectional views for use in illustrating steps in the method of manufacturing the FPC board according to the fourth embodiment.

Description will be made of a method of manufacturing the FPC board 1 according to a fourth embodiment by referring to differences from the method of manufacturing the FPC board 1 according to the first embodiment. The adhesive pattern 7 is not photosensitive in the present embodiment. FIGS. 10 and 11 show sectional views for use in illustrating steps in the method of manufacturing the FPC board 1 according to the fourth embodiment.

As shown in FIG. 10(a), first, the carrier layer 8 having a pressure sensitive adhesive layer, the conductor layer 30 and the adhesive layer precursor 7p are prepared. The adhesive layer precursor 7p is formed on a separator 23.

Next, the conductor layer 30 is laminated on the carrier layer 8, and the adhesive layer precursor 7p is laminated on the conductor layer 30 as shown in FIG. 10(b). The carrier layer 8, the conductor layer 30 and the adhesive layer precursor 7p may be laminated by a laminator, or may be laminated by being subjected to contact bonding by a pressing machine. The separator 23 is subsequently separated from the adhesive layer precursor 7p. The adhesive layer precursor 7p may be formed on the conductor layer 30 by application similarly to the foregoing first to third embodiments.

Then, the adhesive layer 7q is formed by drying the adhesive layer precursor 7p, and a plurality of portions are punched out from the adhesive layer 7q, the conductor layer 30 and the carrier layer 8 using a die, thereby forming a plurality of through holes HA as shown in FIG. 10(c). Thus, the openings H11, H12 are formed in the conductor layer 30. Slits TH that extend along the shapes of the collector portions 3a to 3j, the connection conductor portions 3k to 3n and the drawn-out conductor portions 3o, 3p (see FIG. 1(a)) are formed in the adhesive layer 7q and the conductor layer 30 using the die. In this case, the formation of the through holes HA and the formation of the slits TH may be simultaneously performed using a common die, or sequentially performed using different dies. The slits TH are preferably formed to reach the pressure sensitive adhesive layer of the carrier layer 8.

Next, unnecessary parts of the adhesive layer 7q and the conductor layer 30 separated by the slits TH are removed as shown in FIG. 10(d). Thus, the collector portions 3a to 3j, the connection conductor portions 3k to 3n, the drawn-out conductor portions 3o, 3p (see FIG. 1(a)) and the adhesive pattern 7 are formed on the carrier layer 8. In the step shown in FIG. 10(c), the slits TH are formed to reach the pressure sensitive adhesive layer of the carrier layer 8, thereby causing the unnecessary parts of the adhesive layer 7q and the conductor layer 30 to be easily removed.

The base insulating layer 2 is subsequently joined onto the collector portions 3a to 3j, the connection conductor portions 3k to 3n and the drawn-out conductor portions 3o, 3p with the adhesive pattern 7 sandwiched therebetween as shown in FIG. 11(a). After that, the carrier layer 8 is separated from the collector portions 3a to 3j, the connection conductor portions 3k to 3n and the drawn-out conductor portions 3o, 3p as shown in FIG. 11(b).

Next, the cover layers 6a to 6n (see FIG. 1(a)) are formed by application or lamination on the base insulating layer 2 to cover the collector portions 3a to 3j, the connection conductor portions 3k to 3n and the drawn-out conductor portions 3o, 3p as shown in FIG. 11(c). Here, the drawn-out electrodes 5a, 5b (see FIG. 1(a)) are exposed while not covered with the cover layers 6a, 6j. The top-to-bottom direction in the sectional views of FIGS. 11(c) and (d) is the reverse of that in the sectional view of FIG. 11(b).

Finally, the base insulating layer 2 is cut in the given shape, so that the FPC board 1 including the base insulating layer 2, the collector portions 3a to 3j, the connection conductor portions 3k to 3n, the drawn-out conductor portions 3o, 3p and the cover layers 6a to 6n is completed as shown in FIG. 11(d).

In the method of manufacturing the FPC board 1 according to the present embodiment, the through holes HA and the slits TH are formed by the die, so that the collector portions 3a to 3j, the connection conductor portions 3k to 3n, the drawn-out conductor portions 3o, 3p and the adhesive pattern 7 are formed. In this case, the processing such as exposure, development or etching is not performed, thus facilitating the manufacture of the FPC board 1. This results in reduction in the manufacturing steps and cost.

The base insulating layer 2 is joined to the collector portions 3a to 3j, the connection conductor portions 3k to 3n and the drawn-out conductor potions 3o, 3p after the collector portions 3a to 3j, the connection conductor portions 3k to 3n, the drawn-out conductor portions 3o, 3p and the adhesive pattern 7 are formed, thus inhibiting the base insulating layer 2 from being damaged when the through holes HA and the slits TH are formed by the die. This prevents reduction in the yield.

Annular slits may be formed in corresponding portions of the adhesive layer 7q and the conductor layer 30 in the step shown in FIG. 10(c), and portions of the adhesive layer 7q and the conductor layer 30 in the inside of the annular slits may be removed in the step shown in FIG. 10(d) instead of punching out the portions from the adhesive layer 7q, the conductor layer 30 and the carrier layer 8 and forming the through holes HA in the step shown in FIG. 10(c). In this case, the adhesive layer 7q and the conductor layer 30 need to be removed at the plurality of corresponding portions. The through holes HA are preferably formed by punching out the portions from the adhesive layer 7q, the conductor layer 30 and the carrier layer 8 for simplifying the manufacturing steps.

Meanwhile, the adhesive layer 7q, the conductor layer 30 and the carrier layer 8 may be punched to correspond to the shapes of the collector portions 3a to 3j, the connection conductor portions 3k to 3n and the drawn-out conductor portions 3o, 3p in the step shown in FIG. 10(c) instead of forming the slits TH in the adhesive layer 7q and the conductor layer 30 to correspond to the shapes of the collector portions 3a to 3j, the connection conductor portions 3k to 3n and the drawn-out conductor portions 3o, 3p in the step shown in FIG. 10(c), and removing the unnecessary parts of the adhesive layer 7q and the conductor layer 30 in the step shown in FIG. 10 (d). In this case, however, the adhesive layer 7q, the conductor layer 30 and the carrier layer 8 are divided into a plurality of parts. It is preferable to form the slits TH in the adhesive layer 7q and the conductor layer 30 to correspond to the shapes of the collector portions 3a to 3j, the connection conductor portions 3k to 3n and the drawn-out conductor portions 3o, 3p and remove the unnecessary parts in the following step in order to improve handleability.

[5] Fifth Embodiment

Description will be made of a method of manufacturing the FPC board 1 according to a fifth embodiment while referring to differences from the method of manufacturing the FPC board 1 according to the fourth embodiment.

In the present embodiment, the through holes HA and the slits TH are formed by lasering instead of using the die in the step shown in FIG. 10(c). Then, the unnecessary parts of the adhesive layer 7q and the conductor layer 30 divided by the slits TH are removed, so that the collector portions 3a to 3j, the connection conductor portions 3k to 3n, the drawn-out conductor portions 3o, 3p (see FIG. 1(a)) and the adhesive pattern 7 are formed on the carrier layer 8 as shown in FIG. 10(d).

Also in the manufacturing method according to the present embodiment, the processing such as exposure, development or etching is not performed, thus facilitating the manufacture of the FPC board 1. This results in reduction in the manufacturing steps and cost.

The base insulating layer 2 is joined to the collector portions 3a to 3j, the connection conductor portions 3k to 3n and the drawn-out conductor portions 3o, 3p after the collector portions 3a to 3j, the connection conductor portions 3k to 3n, the drawn-out conductor portions 3o, 3p and the adhesive pattern 7 are formed, thus inhibiting the base insulating layer 2 from being damaged when the through holes HA and the slits TH are formed by lasering. This prevents reduction in the yield.

[6] Other Embodiments

While the porous ePTFE is used as the material for the base insulating layer 2 in the above-described embodiments, the present invention is not limited to this. Instead of ePTFE, epoxy resin, polyimide resin, polyetherimide resin, polyamide-imide resin, polyethylene terephthalate resin, polyethylene naphthalate resin, polybutylene terephthalate resin, polyolefin resin, cycloolefin polymer resin, polyarylate resin, polymethyl methacrylate polymer resin, liquid crystal polymer resin, polycarbonate resin, polyphenylene-sulfide resin, polyether ether ketone resin, polyether sulfone resin, polyacetal resin, polytetrafluoroethylene resin, polyvinylidene fluoride resin, polyester resin, polyurethane resin, or a porous film of those types of resin, for example, may be used as the material for the base insulating layer 2.

While copper is used as the material for the collector portions 3a to 3j, the connection conductor portions 3k to 3n and the drawn-out conductor portions 3o, 3p, the present invention is not limited to this. For example, another metal such as gold (Au), silver or aluminum or an alloy such as a copper alloy, a gold alloy, a silver alloy or an aluminum alloy may be used instead of copper.

While the FPC board 1 includes the five pairs of collector portions (collector portions 3a, 3f, collector portions 3b, 3g, collector portions 3c, 3h, collector portions 3d, 3i and collector portions 3e, 3j) in the above-described embodiments, the present invention is not limited to this. The number of collector portions in the FPC board 1 may be four pairs or less or may be six pairs or more. This allows any number of electrode films 35 to be connected in series. The FPC board 1 may include one pair of collector portions. In this case, the connection conductor portions 3k to 3n are not provided.

[7] Correspondences Between Elements in the Claims and Parts in Embodiments

In the following paragraphs, non-limiting examples of correspondences between various elements recited in the claims below and those described above with respect to various preferred embodiments of the present invention are explained.

In the above-described embodiments, the carrier layer 8 is an example of a support layer, the conductor layer 30 is an example of a conductor layer, the collector portions 3a to 3j, the connection conductor portions 3k to 3n and the drawn-out conductor portions 3o, 3p are examples of a conductor pattern, the base insulating layer 2 is an example of an insulating layer, the FPC board 1 is an example of a printed circuit board, the adhesive layer precursor 7p is an example of an adhesive layer, and the adhesive pattern 7 is an example of an adhesive pattern.

As each of various elements recited in the claims, various other elements having configurations or functions described in the claims can be also used.

[8] Inventive Examples (1) Inventive Examples and Comparative Example

In inventive examples 1 to 4 and a comparative example 1, the FPC boards 1 were manufactured based on the foregoing embodiments. Description will be made of methods of manufacturing the FPC boards 1 in the inventive examples 1 to 4 and the comparative example 1.

The adhesive layer precursor 7p in the inventive example 1 was prepared as follows. The adhesive layer precursor 7p whose solid content concentration was 50% by weight was prepared by dissolving 40 parts by weight of biphenyl-type epoxy resin of epoxy equivalent of 190, 60 parts by weight of bisphenol F-type epoxy resin of epoxy equivalent of 4500, and 9 parts by weight of 4,4-bis[di(6-hydroxyethoxy)phenyl-sulfinio]phenylsulfide-bis(hexafluoroantimonate) as a photoacid generating agent in dioxane. The adhesive layer precursor 7p was positive photosensitive.

The FPC board 1 of the inventive example 1 was manufactured based on the manufacturing method of the FPC board 1 according to the first embodiment. In the FPC board 1 of the inventive example 1, the foregoing adhesive layer precursor 7p was applied on the entire surface including the upper surfaces (surfaces not in contact with the carrier layer 8) of the collector portions 3a to 3j, the connection conductor portions 3k to 3n and the drawn-out conductor portions 3o, 3p in condition at a temperature of 90° C., a pressure of 0.4 MPa and speed of 1 m/min in the step shown in FIG. 3(b).

Next, the upper surface (surface not in contact with the collector portions 3a to 3j, the connection conductor portions 3k to 3n and the drawn-out conductor portions 3o, 3p) of the adhesive layer precursor 7p was irradiated with ultraviolet rays of 800 mJ/cm$^2$ with the mask pattern having the inverted shape of the collector portions 3a to 3j, the connection conductor portions 3k to 3n and the drawn-out conductor portions 3o, 3p sandwiched therebetween, followed by curing treatment for 10 minutes at a temperature of 90° C. in the step shown in FIG. 3(c). After that, the adhesive layer precursor 7p was developed for 9 minutes using a development solution produced by adding TMAH (tetramethyl ammonium hydroxide) by 1.2% in a mixed solvent of water and ethanol whose weight ratio was 1:1, so that the adhesive pattern 7 having the given pattern was formed.

The collector portions 3a to 3j, the connection conductor portions 3k to 3n and the drawn-out conductor portions 3o, 3p were subsequently joined to the base insulating layer 2 made of ePTFE (NTF-1122 by Nitto Denko Co., Ltd.) for 30 minutes in condition at a temperature of 100° C. and a pressure of 5 MPa with the adhesive pattern 7 sandwiched therebetween, followed by curing treatment for 30 minutes at a temperature of 150° C. in the step shown in FIG. 3(d). Finally, the carrier layer 8 was separated from the collector portions 3a to 3j, the connection conductor portions 3k to 3n and the drawn-out conductor portions 3o, 3p in the step shown in FIG. 4(a).

The adhesive layer precursor 7p in the inventive example 2 was prepared as follows. A polyimide precursor solution was prepared by dissolving 67% by weight of ethylene glycol bistrimellitic acid dianhydride as a dianhydride component, 32% by weight of 1,12-diaminodecane as a diamine component, and 1% by weight of 1,3-bis-(3-aminopropyl)tetramethyldisiloxane in N,N-dimethylacetamide, followed by reaction for five hours at a room temperature. Here, total concentration of the dianhydride component and the diamine component was 30% by weight. 1-ethyl-3,5-dimethoxycarbonyl-4-(2-nitrophenyl)-1,4-dihydropyridine as a sensitizing agent was added in the polyimide precursor solution. The concentration of the added sensitizing agent was 15% by weight with respect to the solid content of the solution. Then, the sensitizing agent was uniformly dissolved in the solution, so that the adhesive layer precursor 7p made of photosensitive polyimide was prepared. The adhesive layer precursor 7p was negative photosensitive.

The FPC board 1 of the inventive example 2 was manufactured based on the method of manufacturing the FPC board 1 according to the first embodiment. In the FPC board of the inventive example 2, the foregoing adhesive layer precursor 7p was applied on the entire surface including the upper surfaces (surfaces not in contact with the carrier layer 8) of the collector portions 3a to 3j, the connection conductor portions 3k to 3n and the drawn-out conductor portions 3o, 3p in the step shown in FIG. 3(b), and dried for 10 minutes at a temperature of 100° C.

The upper surface (surface not in contact with the collector portions 3a to 3j, the connection conductor portions 3k to 3n and the drawn-out conductor portions 3o, 3p) of the adhesive layer precursor 7p was irradiated with ultraviolet rays of 3000 mJ/cm² with the mask pattern having the inverted shape of the collector portions 3a to 3j, the connection conductor portions 3k to 3n and the drawn-out conductor portions 3o, 3p sandwiched therebetween, followed by curing treatment for 10 minutes at a temperature of 135° C. in the step shown in FIG. 3(c). After that, the adhesive layer precursor 7p was developed for 6 minutes using a development solution made of N-methyl-2-pyrolidone, so that the adhesive pattern 7 having the given pattern was formed.

The collector portions 3a to 3j, the connection conductor portions 3k to 3n and the drawn-out conductor portions 3o, 3p were joined to the base insulating layer 2 made of ePTFE (NTF-1122 by Nitto Denko Co., Ltd.) for 30 minutes in condition at a temperature of 200° C. and a pressure of 5 MPa with the adhesive pattern 7 sandwiched therebetween, followed by curing treatment for 30 minutes at a temperature of 200° C. in the step shown in FIG. 3(d). Finally, the carrier layer 8 was separated from the collector portions 3a to 3j, the connection conductor portions 3k to 3n and the drawn-out conductor portions 3o, 3p in the step shown in FIG. 4(a).

The adhesive layer precursor 7p in the inventive example 3 was prepared in the same manner as the adhesive layer precursor 7p in the inventive example 1.

The FPC board 1 of the inventive example 3 was manufactured based on the method of manufacturing the FPC board 1 according to the second embodiment. In the FPC board 1 of the inventive example 3, the foregoing adhesive layer precursor 7p was applied on the entire surface including the upper surfaces (surfaces not in contact with the carrier layer 8) of the collector portions 3a to 3j, the connection conductor portions 3k to 3n and the drawn-out conductor portions 3o, 3p in condition at a temperature of 90° C., a pressure of 0.4 MPa and speed of 1 m/min in the step shown in FIG. 7(b).

The upper surface (surface not in contact with the collector portions 3a to 3j, the connection conductor portions 3k to 3n and the drawn-out conductor portions 3o, 3p) of the adhesive layer precursor 7p was irradiated with ultraviolet rays of 800 mJ/cm² with the mask pattern having the inverted shape of the collector portions 3a to 3j, the connection conductor portions 3k to 3n and the drawn-out conductor portions 3o, 3p sandwiched therebetween, followed by curing treatment for 10 minutes at a temperature of 90° C. in the step shown in FIG. 7(c). After that, the adhesive layer precursor 7p was developed for 9 minutes using a development solution produced by adding TMAH by 1.2% in a mixed solvent of water and ethanol whose weight ratio was 1:1, so that the adhesive pattern 7 having the given pattern was formed.

The collector portions 3a to 3j, the connection conductor portions 3k to 3n and the drawn-out conductor portions 3o, 3p were joined to the base insulating layer 2 made of ePTFE (NTF-1122 by Nitto Denko Co., Ltd.) for 30 minutes in condition at a temperature of 100° C. and a pressure of 5 MPa with the adhesive pattern 7 sandwiched therebetween, followed by curing treatment for 30 minutes at a temperature of 150° C. in the step shown in FIG. 8(a). Finally, the carrier layer 8 was separated from the collector portions 3a to 3j, the connection conductor portions 3k to 3n and the drawn-out conductor portions 3o, 3p in the step shown in FIG. 8(b).

The adhesive layer precursor 7p in the inventive example 4 was prepared as follows. A polyimide precursor solution was prepared by dissolving substantially equimolar amounts of 3,3',4,4'-biphenyltetracarboxylic dianhydride as a dianhydride component and 4,4'-diaminodiphenylsulfone as a diamine component in N,N-dimethylacetamide, followed by reaction for 24 hours at room temperature. Here, total concentration of the dianhydride component and the diamine component was 30% by weight. A vinyl ether compound represented by the following formula (1) was added and mixed in the polyimide precursor solution. Here, the added amount of the vinyl ether compound was 40 parts by weight with respect to 100 parts by weight of a solid content of a solution. Then, diphenyliodonium-8-anilinonaphthalene-1-sulfonate as a photodegradable proton generating agent was added and mixed in the polyimide precursor solution. Here, the added amount of the photodegradable proton generating agent was 10 parts by weight with respect to 100 parts by weight of the solid content of the solution. After that, the vinyl ether compound and the photodegradable proton generating agent were uniformly dissolved in the solution, so that the adhesive layer precursor 7p made of photosensitive polyimide was prepared. The adhesive layer precursor 7p was positive photosensitive.

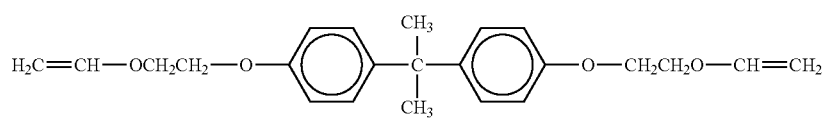

(1)

The FPC board 1 of the inventive example 4 was manufactured based on the method of manufacturing the FPC board 1 according to the first embodiment. In the FPC board 1 of the inventive example 4, the foregoing adhesive layer precursor 7p was applied on the entire surface including the upper surfaces (surfaces not in contact with the carrier layer 8) of the collector portions 3a to 3j, the connection conductor portions 3k to 3n and the drawn-out conductor portions 3o, 3p, and dried for 10 minutes at a temperature of 100° C. in the step shown in FIG. 3(d).

Then, the lower surface of the adhesive layer precursor 7p (surface in contact with the collector portions 3a to 3j, the connection conductor portions 3k to 3n and the drawn-out conductor portions 3o, 3p) was irradiated with ultraviolet rays of 3000 mJ/cm², followed by curing treatment for 10 minutes at a temperature of 110° C. in the step shown in FIG. 3(c). After that, the adhesive layer precursor 7p was developed for 9 minutes using a development solution made of 1.5% by weight of a TMAH aqueous solution, so that the adhesive pattern 7 having the given pattern was formed.

The collector portions 3a to 3j, the connection conductor portions 3k to 3n and the drawn-out conductor portions 3o, 3p were subsequently joined to the base insulating layer 2 made of ePTFE (NTF-1122 by Nitto Denko Co., Ltd.) for 30 minutes in condition at a temperature of 200° C. and a pressure of 5 MPa with the adhesive pattern 7 sandwiched therebetween, followed by curing treatment for 120 minutes at a temperature of 200° C. in the step shown in FIG. 3(d). Finally, the carrier layer 8 was separated from the collector portions 3a to 3j, the connection conductor portions 3k to 3n and the drawn-out conductor portions 3o, 3p in the step shown in FIG. 4(a).

The adhesive layer precursor 7p in the comparative example 1 was prepared as follows. 80 parts by weight of epoxy resin (jER-1007 by Japan Epoxy Resin Co., Ltd.) dissolved in MEK (Methyl Ethyl Ketone), 20 parts by weight of epoxy resin (YL-7410 by Japan Epoxy Resin Co., Ltd.), 8 parts by weight of acid anhydride (MH-700 by New Japan Chemical Co., Ltd.) which was a curing agent and 2 parts by weight of imidazole (2E4MZ by Shikoku Chemicals Corporation) which was a catalyst were mixed, so that the adhesive layer precursor 7p was prepared. The adhesive layer precursor 7p was not photosensitive.

Figure 12:
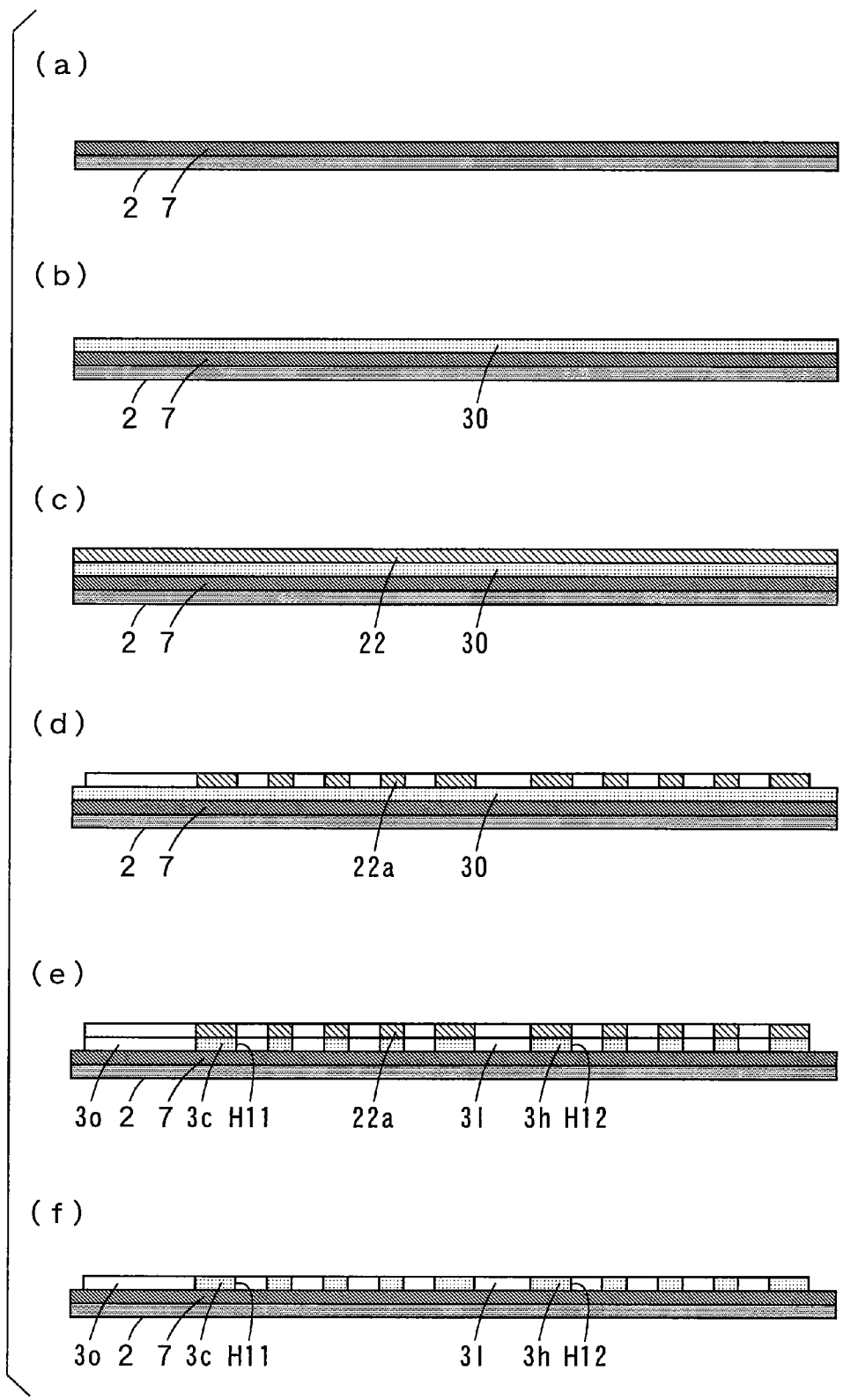
FIGS. 12(a) to (f) are sectional views for use in illustrating steps in a method of manufacturing an FPC board in a comparative example 1.

FIG. 12 is a sectional view for use in illustrating steps in the method of manufacturing the FPC board 1 in the comparative example 1. The FPC board 1 of the comparative example 1 was manufactured according to the method of manufacturing the FPC board 1 shown in FIG. 12. In the FPC board 1 of the comparative example 1, the foregoing adhesive layer precursor 7p was applied on the base insulating layer 2 made of ePTFE (NTF-1122 by Nitto Denko Co., Ltd.), and dried for 10 minutes at a temperature of 100° C., so that the adhesive pattern 7 was formed as shown in FIG. 12(a).

Next, the conductor layer 30 was subjected to contact bonding on the base insulating layer 2 with the adhesive pattern 7 sandwiched therebetween for 30 minutes in condition at a temperature of 100° C. and a pressure of 5 MPa as shown in FIG. 12(b). The resist film 22 was subsequently formed on the conductor layer 30 using the photosensitive dry film resist as shown in FIG. 12(c). After that, the resist film 22 was exposed in the given pattern, followed by development, so that the etching resist pattern 22a was formed as shown in FIG. 12(d).

Next, a region of the conductor layer 30 that was exposed while not covered with the etching resist pattern 22a was removed by etching using ferric chloride as shown in FIG. 12(e). The etching resist pattern 22a was then removed by a stripping solution as shown in FIG. 12(f). Thus, the collector portions 3a to 3j, the connection conductor portions 3k to 3n and the drawn-out conductor portions 3o, 3p (see FIG. 1(a)) were formed on the base insulating layer 2. The plurality of openings H11 were formed in the collector portions 3a to 3e, and the plurality of openings H12 were formed in the collector portions 3f to 3j.

(2) Inspection for Contaminants and Defects on the Surfaces of the FPC Boards

The FPC boards 1 of the inventive examples 1 to 4 and the comparative example 1 were observed using an optical microscope, and the surfaces of the FPC boards 1 were inspected for contaminants and defects. Here, the defects of the surface of the FPC board 1 refer to deformation of the base insulating layer 2 or the existence of the chemical solution used in the manufacturing steps of the FPC board 1 remaining on the base insulating layer 2.

Contaminants and defects were not recognized on the surfaces of the FPC boards 1 of the inventive examples 1 to 4. On the other hand, the contaminants and defects were recognized on the surface of the FPC board 1 of the comparative example 1.

It was confirmed as a result of the inventive examples 1 to 4 and the comparative example 1 that contaminants and defects were prevented from being generated on the surfaces of the FPC boards 1 manufactured by the manufacturing methods according to the foregoing embodiments.

While preferred embodiments of the present invention have been described above, it is to be understood that variations and modifications will be apparent to those skilled in the art without departing the scope and spirit of the present invention. The scope of the present invention, therefore, is to be determined solely by the following claims.

We claim:

1. A method of manufacturing a printed circuit board comprising the steps of:
    forming a conductor pattern, which is composed of a conductor layer having a given pattern, on one surface of a support layer;
    forming an adhesive pattern, which is composed of an adhesive layer having said given pattern, on said conductor pattern;
    joining an insulating layer onto said conductor pattern with said adhesive pattern sandwiched between said insulating layer and said conductor pattern; and
    separating said support layer from said conductor pattern.

2. The method of manufacturing the printed circuit board according to claim 1, wherein said step of forming said conductor pattern includes the steps of
    preparing a base material having a laminated structure of said support layer and the conductor layer, and
    forming said conductor pattern on said one surface of said support layer by processing said conductor layer.

3. The method of manufacturing the printed circuit board according to claim 2, wherein
    said step of joining the insulating layer onto said conductor pattern further includes the steps of
    forming the adhesive layer on said support layer to cover said conductor pattern, and
    forming said adhesive pattern by processing said adhesive layer.

4. The method of manufacturing the printed circuit board according to claim 3, wherein
    said adhesive layer is photosensitive, and
    said step of processing said adhesive layer includes the step subjecting said adhesive layer to exposure processing and development processing to form said adhesive pattern.

5. The method of manufacturing the printed circuit board according to claim 4, wherein said step of subjecting said adhesive layer to the exposure processing and the development processing includes the step of irradiating said adhesive layer with light through said support layer using said conductor pattern as a mask.

6. A method of manufacturing a printed circuit board comprising the steps of:
    preparing a base material having a laminated structure of a support layer and a conductor layer;
    forming an adhesive pattern, which is composed of an adhesive layer having a given pattern, on said conductor layer;
    forming a conductor pattern having said given pattern on one surface of said support layer by removing an exposed region of said conductor layer using said adhesive pattern as a mask; and
    joining an insulating layer onto said conductor pattern with said adhesive pattern sandwiched between said insulating layer and said conductor pattern.

7. The method of manufacturing the printed circuit board according to claim 6, wherein
    said adhesive layer is photosensitive, and said step of forming said adhesive pattern on said conductor layer includes the step of forming said adhesive pattern by subjecting said adhesive layer to exposure processing and development processing.

8. A method of manufacturing a printed circuit board comprising the steps of:
   preparing a base material having a laminated structure of a support layer and a conductor layer;
   forming a conductor pattern having a given pattern on one surface of said support layer by processing said conductor layer;
   forming a laminated structure of an adhesive layer and an insulating layer on said conductor pattern; and
   forming an adhesive pattern having said given pattern by separating said support layer and then removing a region of said adhesive layer that is exposed.

9. The method of manufacturing the printed circuit board according to claim 8, wherein said step of removing the region of said adhesive layer that is exposed while not overlapping said conductor pattern includes the step of removing said region of said adhesive layer using plasma.

10. The method of manufacturing the printed circuit board according to claim 1, wherein said step of forming said conductor pattern includes the step of etching the conductor pattern by wet etching.

11. The method of manufacturing the printed circuit board according to claim 1, wherein said insulating layer contains a porous material.

12. The method of manufacturing the printed circuit board according to claim 1, wherein
   said step of forming said conductor pattern and said step of forming said adhesive pattern include the steps of
   forming a laminated structure of said support layer, the conductor layer and an adhesive layer, and
   forming said conductor pattern having said given pattern on said one surface of said support layer and forming said adhesive pattern having said given pattern on said conductor pattern by dividing respective unnecessary portions of said conductor layer and said adhesive layer from said laminated structure.

\* \* \* \* \*